United States Patent
Matsuyama

(10) Patent No.: US 11,139,189 B2
(45) Date of Patent: Oct. 5, 2021

(54) SUBSTRATE PROCESSING APPARATUS AND SUBSTRATE PROCESSING METHOD

(71) Applicant: Tokyo Electron Limited, Tokyo (JP)

(72) Inventor: Kenichirou Matsuyama, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 74 days.

(21) Appl. No.: 16/774,098

(22) Filed: Jan. 28, 2020

(65) Prior Publication Data

US 2020/0243365 A1 Jul. 30, 2020

(30) Foreign Application Priority Data

Jan. 28, 2019 (JP) .............................. JP2019-012412
Jul. 29, 2019 (JP) .............................. JP2019-139113

(51) Int. Cl.
*H01L 21/677* (2006.01)
*H01L 21/687* (2006.01)
(Continued)

(52) U.S. Cl.
CPC ...... *H01L 21/67745* (2013.01); *G03F 7/7075* (2013.01); *G03F 7/70483* (2013.01);
(Continued)

(58) Field of Classification Search
CPC .. G03F 7/70483; G03F 7/705; G03F 7/70525; G03F 7/70716; G03F 7/7075; G03F 7/70991; H01L 21/30; H01L 21/67; H01L 21/677; H01L 21/67703; H01L 21/67739; H01L 21/67742; H01L 21/67745; H01L 21/6776
(Continued)

(56) References Cited

U.S. PATENT DOCUMENTS 9,227,318 B1* 1/2016 Bai .................. H01L 21/67184
2002/0192055 A1* 12/2002 Kobayachi ............ G06Q 50/04
414/200

(Continued)

FOREIGN PATENT DOCUMENTS

JP 2010-147424 A 7/2010

*Primary Examiner* — Colin W Kreutzer
(74) *Attorney, Agent, or Firm* — Abelman, Frayne & Schwab

(57) ABSTRACT

A substrate processing apparatus includes: a processing block in which a substrate is sequentially transferred and processed; a carry-in/out transfer mechanism that carrys-in/out the substrate with respect to modules; a carry-out module configured to place the substrate therein after the substrate is processed; a multi-module configured by a plurality of modules having a same order in which the substrate is transferred in the processing block; a main transfer mechanism that moves around in a transfer path provided in the processing block to deliver the substrate among the modules; and a controller that sets a first transfer schedule including determination of a number of modules to become transfer destinations of the substrate in the multi-module, and determination of a number of stay cycles which is a number of times that the main transfer mechanism moves around after the substrate is carried into the multi-module until the substrate is carried out.

17 Claims, 19 Drawing Sheets

(51) Int. Cl.
  *G03F 7/20*   (2006.01)
  *H01L 21/30*  (2006.01)
(52) U.S. Cl.
  CPC .... *G03F 7/70716* (2013.01); *H01L 21/67742* (2013.01); *H01L 21/68707* (2013.01); *H01L 21/30* (2013.01)
(58) Field of Classification Search
  USPC ....... 355/27, 72, 77; 414/935; 438/907, 908; 700/14, 121
  See application file for complete search history.

(56) References Cited

U.S. PATENT DOCUMENTS

| | | | |
|---|---|---|---|
| 2003/0120371 A1* | 6/2003 | Joma | G05B 19/41865 700/100 |
| 2009/0098298 A1* | 4/2009 | Miyata | H01L 21/67276 427/372.2 |
| 2014/0112743 A1* | 4/2014 | Morisawa | H01L 21/67703 414/222.13 |
| 2018/0081336 A1* | 3/2018 | Wu | G05B 19/41815 |

* cited by examiner

FIG. 4

| CSWP 1 | CSWP 2 | CSWP 3 | SCPL 1 | SCPL 2 | DEV 1 | DEV 2 | DEV 3 | DEV 4 | CGHP 1 | CGHP 2 | CGHP 3 | SCPL' 1 | SCPL' 2 | Cycle Time |
|---|---|---|---|---|---|---|---|---|---|---|---|---|---|---|
| A01 | | | | | | | | | | | | | | 12 |
| ↓ | A02 | | | | | | | | | | | | | 12 |
| ↓ | ↓ | A03 | | | | | | | | | | | | 12 |
| A04 | ↓ | ↓ | A01 | | | | | | | | | | | 12 |
| ↓ | A05 | ↓ | ↓ | A02 | | | | | | | | | | 12 |
| ↓ | ↓ | A06 | A03 | ↓ | A01 | | | | | | | | | 12 |
| A07 | ↓ | ↓ | A04 | ↓ | A02 | | | | | | | | | 12 |
| ↓ | A08 | ↓ | A05 | ↓ | ↓ | A03 | | | | | | | | 12 |
| ↓ | ↓ | A09 | ↓ | A06 | ↓ | ↓ | A04 | | | | | | | 12 |
| A10 | ↓ | ↓ | A07 | ↓ | A05 | ↓ | ↓ | ↓ | A01 | | | | | 12 |
| ↓ | A11 | ↓ | ↓ | A08 | ↓ | A06 | ↓ | ↓ | ↓ | A02 | | | | 12 |
| ↓ | ↓ | A12 | A09 | ↓ | ↓ | ↓ | A07 | ↓ | ↓ | ↓ | A03 | | | 12 |
| A13 | ↓ | ↓ | ↓ | A10 | ↓ | ↓ | ↓ | A08 | A04 | ↓ | ↓ | A01 | | 12 |
| ↓ | A14 | ↓ | A11 | ↓ | A09 | ↓ | ↓ | ↓ | ↓ | A05 | ↓ | ↓ | A02 | 12 |
| ↓ | ↓ | A15 | ↓ | A12 | ↓ | A10 | ↓ | ↓ | ↓ | ↓ | A06 | A03 | | 12 |
| A16 | ↓ | ↓ | A13 | ↓ | ↓ | ↓ | A11 | ↓ | A07 | ↓ | ↓ | ↓ | A04 | 12 |
| ↓ | A17 | ↓ | ↓ | A14 | ↓ | ↓ | ↓ | A12 | ↓ | A08 | ↓ | A05 | | 12 |
| ↓ | ↓ | A18 | A15 | ↓ | A13 | ↓ | ↓ | ↓ | ↓ | ↓ | A09 | | A06 | 12 |
| A19 | ↓ | ↓ | ↓ | A16 | ↓ | A14 | ↓ | ↓ | A10 | ↓ | ↓ | A07 | | 12 |
| ↓ | A20 | ↓ | A17 | ↓ | ↓ | ↓ | A15 | ↓ | ↓ | A11 | ↓ | | A08 | 12 |
| ↓ | ↓ | B01 | ↓ | A18 | ↓ | ↓ | ↓ | A16 | ↓ | ↓ | A12 | A09 | | 12 |
| B02 | ↓ | ↓ | A19 | ↓ | A17 | ↓ | ↓ | ↓ | A13 | ↓ | ↓ | ↓ | A10 | 12 |
| ↓ | B03 | ↓ | ↓ | A20 | ↓ | A18 | ↓ | ↓ | ↓ | A14 | ↓ | A11 | | 12 |
| ↓ | ↓ | ↓ | ↓ | ↓ | ↓ | ↓ | A19 | ↓ | ↓ | ↓ | A15 | | A12 | 12 |
| ↓ | ↓ | B04 | B01 | | ↓ | ↓ | ↓ | A20 | A16 | ↓ | ↓ | A13 | | 12 |
| ↓ | ↓ | ↓ | ↓ | B02 | ↓ | ↓ | ↓ | ↓ | A17 | ↓ | ↓ | | A14 | 12 |
| B05 | | ↓ | B03 | ↓ | B01 | ↓ | ↓ | ↓ | ↓ | A18 | A15 | | | 12 |
| ↓ | B06 | ↓ | ↓ | ↓ | ↓ | B02 | ↓ | ↓ | A19 | ↓ | ↓ | | A16 | 12 |
| ↓ | ↓ | B07 | | B04 | ↓ | ↓ | B03 | | ↓ | A20 | ↓ | A17 | | 12 |
| ↓ | ↓ | ↓ | | ↓ | ↓ | ↓ | ↓ | | ↓ | ↓ | | | A18 | 12 |
| C1 → B08 | ↓ | ↓ | B05 | | ↓ | ↓ | ↓ | B04 | | | ↓ | A19 | | 12 |
| ↓ | | ↓ | | B06 | ↓ | ↓ | ↓ | ↓ | | | | | A20 | 12 |
| ↓ | B09 | ↓ | B07 | ↓ | B05 | ↓ | ↓ | ↓ | | | B01 | | | 12 |
| ↓ | ↓ | B10 | ↓ | | ↓ | B06 | ↓ | ↓ | B02 | | ↓ | | | 12 |
| B11 | ↓ | ↓ | | B08 | ↓ | ↓ | B07 | ↓ | ↓ | B03 | ↓ | | | 12 |
| ↓ | ↓ | ↓ | | ↓ | ↓ | ↓ | ↓ | ↓ | ↓ | ↓ | ↓ | | | 12 |
| ↓ | B12 | ↓ | B09 | | ↓ | ↓ | ↓ | B08 | ↓ | ↓ | B04 | B01 | | 12 |
| ↓ | ↓ | ↓ | ↓ | B10 | ↓ | ↓ | ↓ | ↓ | ↓ | ↓ | ↓ | | B02 | 12 |
| ↓ | ↓ | B13 | B11 | ↓ | B09 | ↓ | ↓ | ↓ | B05 | | ↓ | B03 | | 12 |
| B14 | ↓ | ↓ | ↓ | | ↓ | B10 | ↓ | ↓ | ↓ | B06 | ↓ | | | 12 |
| ↓ | B15 | ↓ | B12 | ↓ | ↓ | ↓ | B11 | ↓ | ↓ | ↓ | B07 | B04 | | 12 |
| ↓ | ↓ | ↓ | ↓ | | ↓ | ↓ | ↓ | ↓ | ↓ | ↓ | ↓ | | | 12 |
| ↓ | ↓ | B16 | B13 | | ↓ | ↓ | ↓ | B12 | B08 | ↓ | ↓ | B05 | | 12 |
| ↓ | ↓ | ↓ | ↓ | B14 | ↓ | ↓ | ↓ | ↓ | ↓ | ↓ | ↓ | | B06 | 12 |
| B17 | ↓ | ↓ | B15 | ↓ | B13 | ↓ | ↓ | ↓ | ↓ | B09 | ↓ | B07 | | 12 |
| ↓ | B18 | ↓ | ↓ | | B14 | ↓ | ↓ | ↓ | ↓ | ↓ | B10 | | | 12 |
| ↓ | ↓ | B19 | ↓ | B16 | ↓ | ↓ | B15 | ↓ | B11 | ↓ | ↓ | | B08 | 12 |
| ↓ | ↓ | ↓ | ↓ | ↓ | ↓ | ↓ | ↓ | ↓ | ↓ | ↓ | ↓ | | | 12 |
| B20 | ↓ | ↓ | B17 | | ↓ | ↓ | ↓ | B16 | ↓ | B12 | ↓ | B09 | | 12 |
| ↓ | | | ↓ | B18 | ↓ | ↓ | ↓ | ↓ | ↓ | ↓ | ↓ | | B10 | 12 |
| ↓ | | | B19 | ↓ | B17 | ↓ | ↓ | ↓ | ↓ | ↓ | B13 | B11 | | 12 |
| ↓ | | | | ↓ | ↓ | B18 | ↓ | ↓ | B14 | ↓ | ↓ | | | 12 |
| | | | B20 | ↓ | ↓ | ↓ | B19 | ↓ | ↓ | B15 | ↓ | | B12 | 12 |
| | | | | | ↓ | ↓ | ↓ | ↓ | ↓ | ↓ | ↓ | | | 12 |
| | | | | | ↓ | ↓ | ↓ | B20 | ↓ | ↓ | B16 | B13 | | 12 |
| | | | | | | ↓ | ↓ | ↓ | ↓ | ↓ | ↓ | | B14 | 12 |
| | | | | | | | ↓ | ↓ | B17 | ↓ | ↓ | B15 | | 12 |
| | | | | | | | | ↓ | ↓ | B18 | ↓ | | | 12 |
| | | | | | | | | ↓ | ↓ | ↓ | B19 | | B16 | 12 |
| | | | | | | | | | ↓ | ↓ | ↓ | | | 12 |
| | | | | | | | | | B20 | ↓ | ↓ | B17 | | 12 |
| | | | | | | | | | ↓ | ↓ | ↓ | | B18 | 12 |
| | | | | | | | | | | ↓ | ↓ | B19 | | 12 |
| | | | | | | | | | | | ↓ | | | 12 |
| | | | | | | | | | | | | | B20 | 12 |

FIG. 5

| CSWP 1 | CSWP 2 | CSWP 3 | SCPL 1 | SCPL 2 | DEV 1 | DEV 2 | DEV 3 | DEV 4 | CGHP 1 | CGHP 2 | CGHP 3 | SCPL' 1 | SCPL' 2 | Cycle Time |
|---|---|---|---|---|---|---|---|---|---|---|---|---|---|---|
| A01 | | | | | | | | | | | | | | 12 |
| ↓ | A02 | | | | | | | | | | | | | 12 |
| ↓ | ↓ | A03 | | | | | | | | | | | | 12 |
| A04 | ↓ | ↓ | A01 | | | | | | | | | | | 12 |
| ↓ | A05 | ↓ | ↓ | A02 | | | | | | | | | | 12 |
| ↓ | ↓ | A06 | A03 | ↓ | A01 | | | | | | | | | 12 |
| A07 | ↓ | ↓ | ↓ | A04 | ↓ | A02 | | | | | | | | 12 |
| ↓ | A08 | ↓ | A05 | ↓ | ↓ | ↓ | A03 | | | | | | | 12 |
| ↓ | ↓ | A09 | ↓ | A06 | ↓ | ↓ | ↓ | A04 | | | | | | 12 |
| A10 | ↓ | ↓ | A07 | ↓ | A05 | ↓ | ↓ | ↓ | A01 | | | | | 12 |
| ↓ | A11 | ↓ | ↓ | A08 | ↓ | A06 | ↓ | ↓ | ↓ | A02 | | | | 12 |
| ↓ | ↓ | A12 | A09 | ↓ | ↓ | ↓ | A07 | ↓ | ↓ | ↓ | A03 | | | 12 |
| A13 | ↓ | ↓ | A10 | ↓ | ↓ | ↓ | ↓ | A08 | A04 | ↓ | ↓ | A01 | | 12 |
| ↓ | A14 | ↓ | A11 | ↓ | A09 | ↓ | ↓ | ↓ | ↓ | A05 | ↓ | ↓ | A02 | 12 |
| ↓ | ↓ | A15 | ↓ | A12 | ↓ | A10 | ↓ | ↓ | ↓ | ↓ | A06 | A03 | ↓ | 12 |
| A16 | ↓ | ↓ | A13 | ↓ | ↓ | ↓ | A11 | ↓ | A07 | ↓ | ↓ | ↓ | A04 | 12 |
| ↓ | A17 | ↓ | ↓ | A14 | ↓ | ↓ | ↓ | A12 | ↓ | A08 | ↓ | A05 | ↓ | 12 |
| ↓ | ↓ | A18 | A15 | ↓ | A13 | ↓ | ↓ | ↓ | ↓ | ↓ | A09 | ↓ | A06 | 12 |
| A19 | ↓ | ↓ | ↓ | A16 | ↓ | A14 | ↓ | ↓ | A10 | ↓ | ↓ | A07 | ↓ | 12 |
| ↓ | A20 | ↓ | A17 | ↓ | ↓ | ↓ | A15 | ↓ | ↓ | A11 | ↓ | ↓ | A08 | 12 |
| ↓ | ↓ | B01 | ↓ | A18 | ↓ | ↓ | ↓ | A16 | ↓ | ↓ | A12 | A09 | ↓ | 12 |
| B02 | ↓ | ↓ | A19 | ↓ | A17 | ↓ | ↓ | ↓ | A13 | ↓ | ↓ | ↓ | A10 | 12 |
| ↓ | B03 | ↓ | ↓ | A20 | ↓ | A18 | ↓ | ↓ | ↓ | A14 | ↓ | A11 | ↓ | 12 |
| ↓ | ↓ | ↓ | ↓ | ↓ | ↓ | ↓ | A19 | ↓ | ↓ | ↓ | A15 | ↓ | A12 | 12 |
| ↓ | ↓ | B04 | B01 | ↓ | ↓ | ↓ | ↓ | A20 | A16 | ↓ | ↓ | A13 | ↓ | 12 |
| ↓ | ↓ | ↓ | B02 | ↓ | ↓ | ↓ | ↓ | ↓ | ↓ | A17 | ↓ | ↓ | A14 | 12 |
| ↓ | B05 | ↓ | ↓ | B03 | ↓ | ↓ | B01 | ↓ | ↓ | ↓ | A18 | A15 | ↓ | 12 |
| B06 | ↓ | ↓ | ↓ | ↓ | ↓ | B02 | ↓ | ↓ | A19 | ↓ | ↓ | ↓ | A16 | 12 |
| ↓ | ↓ | B07 | ↓ | B04 | ↓ | ↓ | B03 | ↓ | A20 | ↓ | ↓ | A17 | ↓ | 12 |
| ↓ | ↓ | ↓ | ↓ | ↓ | ↓ | ↓ | ↓ | ↓ | ↓ | ↓ | | | A18 | 12 |
| ↓ | B08 | ↓ | ↓ | B05 | B04 | ↓ | ↓ | ↓ | ↓ | ↓ | | A19 | | 12 |
| ↓ | ↓ | ↓ | B06 | ↓ | ↓ | ↓ | ↓ | ↓ | | | | | A20 | 12 |
| ↓ | ↓ | B09 | ↓ | B07 | ↓ | B05 | ↓ | ↓ | B01 | | | | | 12 |
| B10 | ↓ | ↓ | ↓ | ↓ | ↓ | B06 | ↓ | B02 | ↓ | | | | | 12 |
| ↓ | B11 | ↓ | ↓ | B08 | ↓ | ↓ | B07 | ↓ | ↓ | B03 | | | | 12 |
| ↓ | ↓ | ↓ | ↓ | ↓ | ↓ | ↓ | ↓ | ↓ | ↓ | ↓ | | | | 12 |
| ↓ | ↓ | B12 | ↓ | B09 | B08 | ↓ | ↓ | ↓ | B04 | ↓ | B01 | | | 12 |
| ↓ | ↓ | ↓ | B10 | ↓ | ↓ | ↓ | ↓ | ↓ | ↓ | ↓ | B02 | | | 12 |
| ↓ | B13 | ↓ | ↓ | B11 | ↓ | B09 | ↓ | ↓ | ↓ | B05 | B03 | | | 12 |
| B14 | ↓ | ↓ | ↓ | ↓ | ↓ | B10 | ↓ | B06 | ↓ | ↓ | ↓ | | | 12 |
| ↓ | ↓ | B15 | ↓ | B12 | ↓ | ↓ | B11 | ↓ | B07 | ↓ | B04 | | | 12 |
| ↓ | ↓ | ↓ | ↓ | ↓ | ↓ | ↓ | ↓ | ↓ | ↓ | ↓ | | | | 12 |
| ↓ | B16 | ↓ | ↓ | B13 | B12 | ↓ | ↓ | ↓ | ↓ | B08 | B05 | | | 12 |
| ↓ | ↓ | ↓ | B14 | ↓ | ↓ | ↓ | ↓ | ↓ | ↓ | ↓ | B06 | | | 12 |
| ↓ | ↓ | B17 | ↓ | B15 | ↓ | B13 | ↓ | ↓ | B09 | ↓ | B07 | | | 12 |
| B18 | ↓ | ↓ | ↓ | ↓ | ↓ | B14 | ↓ | B10 | ↓ | ↓ | | | | 12 |
| ↓ | B19 | ↓ | ↓ | B16 | ↓ | ↓ | B15 | ↓ | ↓ | B11 | B08 | | | 12 |
| ↓ | ↓ | ↓ | ↓ | ↓ | ↓ | ↓ | ↓ | ↓ | ↓ | ↓ | | | | 12 |
| ↓ | ↓ | B20 | ↓ | B17 | B16 | ↓ | ↓ | ↓ | B12 | ↓ | B09 | | | 12 |
| ↓ | ↓ | ↓ | B18 | ↓ | ↓ | ↓ | ↓ | ↓ | ↓ | ↓ | B10 | | | 12 |
| | | ↓ | ↓ | B19 | ↓ | B17 | ↓ | ↓ | ↓ | B16 | B11 | | | 12 |
| | | | | ↓ | ↓ | B18 | ↓ | B14 | ↓ | ↓ | | | | 12 |
| | | | | B20 | ↓ | ↓ | B19 | ↓ | B15 | ↓ | B12 | | | 12 |
| | | | | | ↓ | ↓ | ↓ | ↓ | ↓ | ↓ | | | | 12 |
| | | | | | B20 | ↓ | ↓ | ↓ | ↓ | B16 | B13 | | | 12 |
| | | | | | | ↓ | ↓ | ↓ | ↓ | ↓ | B14 | | | 12 |
| | | | | | | ↓ | ↓ | ↓ | B17 | ↓ | B15 | | | 12 |
| | | | | | | | ↓ | ↓ | B18 | ↓ | | | | 12 |
| | | | | | | | ↓ | ↓ | ↓ | B19 | B16 | | | 12 |
| | | | | | | | | ↓ | ↓ | ↓ | | | | 12 |
| | | | | | | | | ↓ | B20 | ↓ | B17 | | | 12 |
| | | | | | | | | | ↓ | ↓ | B18 | | | 12 |
| | | | | | | | | | | B19 | | | | 12 |
| | | | | | | | | | | ↓ | | | | 12 |
| | | | | | | | | | | | B20 | | | 12 |

FIG. 7

| | CSWP | | | SCPL | | CSWP | | | | CGHP | | | SCPL' | |
|---|---|---|---|---|---|---|---|---|---|---|---|---|---|---|
| | 1 | 2 | 3 | 1 | 2 | 1 | 2 | 3 | 4 | 1 | 2 | 3 | 1 | 2 |
| 1 | A1 | | | | | | | | | | | | | |
| 2 | ↓ | | | | | | | | | | | | | |
| 3 | ↓ | | | | | | | | | | | | | |
| 4 | ↓ | A4 | | | | | | | | | | | | |
| 5 | ↓ | ↓ | | | | | | | | | | | | |
| 6 | ↓ | ↓ | | | | | | | | | | | | |
| 7 | ↓ | ↓ | A7 | | | | | | | | | | | |
| 8 | ↓ | ↓ | ↓ | | | | | | | | | | | |
| 9 | | ↓ | ↓ | A1 | | | | | | | | | | |
| 10 | A10 | ↓ | ↓ | ↓ | | | | | | | | | | |
| 11 | ↓ | ↓ | ↓ | | | A1 | | | | | | | | |
| 12 | ↓ | | ↓ | A4 | | ↓ | | | | | | | | |
| 13 | ↓ | A13 | ↓ | ↓ | | ↓ | | | | | | | | |
| 14 | ↓ | ↓ | ↓ | | | ↓ | A4 | | | | | | | |
| 15 | ↓ | ↓ | | A7 | | ↓ | ↓ | | | | | | | |
| 16 | ↓ | ↓ | A16 | ↓ | | ↓ | ↓ | | | | | | | |
| 17 | ↓ | ↓ | ↓ | | | ↓ | ↓ | A7 | | | | | | |
| 18 | | ↓ | ↓ | A10 | | ↓ | ↓ | ↓ | | | | | | |
| 19 | A19 | ↓ | ↓ | ↓ | | ↓ | ↓ | ↓ | | | | | | |
| 20 | ↓ | ↓ | ↓ | | | ↓ | ↓ | ↓ | A10 | | | | | |
| 21 | ↓ | | ↓ | A13 | | ↓ | ↓ | ↓ | ↓ | | | | | |
| 22 | ↓ | A22 | ↓ | ↓ | | | ↓ | ↓ | ↓ | A1 | | | | |
| 23 | ↓ | ↓ | ↓ | | | A13 | ↓ | ↓ | ↓ | ↓ | | | | |
| 24 | ↓ | ↓ | | A16 | | ↓ | ↓ | ↓ | ↓ | | | | A1 | |
| 25 | ↓ | ↓ | A25 | ↓ | | ↓ | | ↓ | ↓ | A4 | | | | |
| 26 | ↓ | ↓ | ↓ | | | ↓ | A16 | ↓ | ↓ | ↓ | | | | |
| 27 | | ↓ | ↓ | A19 | | ↓ | ↓ | ↓ | ↓ | | | | | A4 |
| 28 | | ↓ | ↓ | ↓ | | ↓ | ↓ | ↓ | ↓ | | A7 | | | |
| 29 | | ↓ | ↓ | | | ↓ | ↓ | A19 | ↓ | | ↓ | | | |
| 30 | | | ↓ | A22 | | ↓ | ↓ | ↓ | ↓ | | | | A7 | |
| 31 | | | ↓ | ↓ | | ↓ | ↓ | ↓ | ↓ | A10 | | | | |
| 32 | | | ↓ | | | ↓ | ↓ | ↓ | A22 | ↓ | | | | |
| 33 | | | | A25 | | ↓ | ↓ | ↓ | ↓ | | | | | A10 |
| 34 | | | | ↓ | | ↓ | ↓ | ↓ | ↓ | | A13 | | | |
| 35 | | | | | | A25 | ↓ | ↓ | ↓ | | ↓ | | | |
| 36 | | | | | | ↓ | ↓ | ↓ | ↓ | | | | A13 | |
| 37 | | | | | | ↓ | | ↓ | ↓ | | A16 | | | |
| 38 | | | | | | ↓ | | ↓ | ↓ | | ↓ | | | |
| 39 | | | | | | ↓ | | ↓ | ↓ | | | | | A16 |
| 40 | | | | | | ↓ | | | ↓ | A19 | | | | |
| 41 | | | | | | ↓ | | | ↓ | ↓ | | | | |
| 42 | | | | | | ↓ | | | ↓ | | | | A19 | |
| 43 | | | | | | ↓ | | | | | A22 | | | |
| 44 | | | | | | ↓ | | | | | ↓ | | | |
| 45 | | | | | | ↓ | | | | | | | | A22 |
| 46 | | | | | | | | | | | A25 | | | |
| 47 | | | | | | | | | | | ↓ | | | |
| 48 | | | | | | | | | | | | | A25 | |
| 49 | | | | | | | | | | | | | | |
| 50 | | | | | | | | | | | | | | |
| 51 | | | | | | | | | | | | | | |

| | CSWP | | | SCPL | | CSWP | | | | CGHP | | | SCPL' | |
|---|---|---|---|---|---|---|---|---|---|---|---|---|---|---|
| | 1 | 2 | 3 | 1 | 2 | 1 | 2 | 3 | 4 | 1 | 2 | 3 | 1 | 2 |
| 1 | A1 | | | | | | | | | | | | | |
| 2 | ↓ | | | | | | | | | | | | | |
| 3 | ↓ | | | | | | | | | | | | | |
| 4 | ↓ | A4 | | | | | | | | | | | | |
| 5 | ↓ | ↓ | | | | | | | | | | | | |
| 6 | ↓ | ↓ | | | | | | | | | | | | |
| 7 | ↓ | ↓ | A7 | | | | | | | | | | | |
| 8 | ↓ | ↓ | ↓ | | | | | | | | | | | |
| 9 | ↓ | ↓ | ↓ | | | | | | | | | | | |
| 10 | A10 | ↓ | ↓ | A1 | | | | | | | | | | |
| 11 | ↓ | ↓ | ↓ | ↓ | | | | | | | | | | |
| 12 | ↓ | ↓ | ↓ | ↓ | | | | | | | | | | |
| 13 | ↓ | A13 | ↓ | A4 | | A1 | | | | | | | | |
| 14 | ↓ | ↓ | ↓ | ↓ | | ↓ | | | | | | | | |
| 15 | ↓ | ↓ | ↓ | ↓ | | ↓ | | | | | | | | |
| 16 | ↓ | ↓ | A16 | A7 | | ↓ | A4 | | | | | | | |
| 17 | ↓ | ↓ | ↓ | ↓ | | ↓ | ↓ | | | | | | | |
| 18 | ↓ | ↓ | ↓ | ↓ | | ↓ | ↓ | | | | | | | |
| 19 | A19 | ↓ | ↓ | A10 | | ↓ | ↓ | A7 | | | | | | |
| 20 | ↓ | ↓ | ↓ | ↓ | | ↓ | ↓ | ↓ | | | | | | |
| 21 | ↓ | ↓ | ↓ | ↓ | | ↓ | ↓ | ↓ | | | | | | |
| 22 | ↓ | A22 | ↓ | A13 | | ↓ | ↓ | ↓ | A10 | | | | | |
| 23 | ↓ | ↓ | ↓ | ↓ | | ↓ | ↓ | ↓ | ↓ | | | | | |
| 24 | ↓ | ↓ | ↓ | ↓ | | ↓ | ↓ | ↓ | ↓ | | | | | |
| 25 | ↓ | ↓ | A25 | A16 | | A13 | ↓ | ↓ | ↓ | A1 | | | | |
| 26 | ↓ | ↓ | ↓ | ↓ | | ↓ | ↓ | ↓ | ↓ | ↓ | | | | |
| 27 | ↓ | ↓ | ↓ | ↓ | | ↓ | ↓ | ↓ | ↓ | ↓ | | | | |
| 28 | | ↓ | ↓ | A19 | | ↓ | A16 | ↓ | ↓ | A4 | | | A1 | |
| 29 | | ↓ | ↓ | ↓ | | ↓ | ↓ | ↓ | ↓ | ↓ | | | | |
| 30 | | ↓ | ↓ | ↓ | | ↓ | ↓ | ↓ | ↓ | ↓ | | | | |
| 31 | | | ↓ | A22 | | ↓ | ↓ | A19 | ↓ | A7 | | | | A4 |
| 32 | | | ↓ | ↓ | | ↓ | ↓ | ↓ | ↓ | ↓ | | | | |
| 33 | | | ↓ | ↓ | | ↓ | ↓ | ↓ | ↓ | ↓ | | | | |
| 34 | | | | A25 | | ↓ | ↓ | ↓ | A22 | A10 | | | A7 | |
| 35 | | | | ↓ | | ↓ | ↓ | ↓ | ↓ | ↓ | | | | |
| 36 | | | | ↓ | | ↓ | ↓ | ↓ | ↓ | ↓ | | | | |
| 37 | | | | | | A25 | ↓ | ↓ | ↓ | A13 | | | | A10 |
| 38 | | | | | | ↓ | ↓ | ↓ | ↓ | ↓ | | | | |
| 39 | | | | | | ↓ | ↓ | ↓ | ↓ | ↓ | | | | |
| 40 | | | | | | ↓ | | ↓ | ↓ | A16 | | | A13 | |
| 41 | | | | | | ↓ | | ↓ | ↓ | ↓ | | | | |
| 42 | | | | | | ↓ | | ↓ | ↓ | ↓ | | | | |
| 43 | | | | | | ↓ | | | ↓ | A19 | | | | A16 |
| 44 | | | | | | ↓ | | | ↓ | ↓ | | | | |
| 45 | | | | | | ↓ | | | ↓ | ↓ | | | | |
| 46 | | | | | | ↓ | | | | A22 | | | A19 | |
| 47 | | | | | | ↓ | | | | ↓ | | | | |
| 48 | | | | | | ↓ | | | | ↓ | | | | |
| 49 | | | | | | | | | | A25 | | | | A22 |
| 50 | | | | | | | | | | ↓ | | | | |
| 51 | | | | | | | | | | ↓ | | | | |
| 52 | | | | | | | | | | | | | A25 | |
| 53 | | | | | | | | | | | | | | |

FIG. 10

| | CSWP | | | SCPL | | CSWP | | | | CGHP | | | SCPL' | |
|---|---|---|---|---|---|---|---|---|---|---|---|---|---|---|
| | 1 | 2 | 3 | 1 | 2 | 1 | 2 | 3 | 4 | 1 | 2 | 3 | 1 | 2 |
| 1 | A1 | | | | | | | | | | | | | |
| 2 | ↓ | | | | | | | | | | | | | |
| 3 | ↓ | | | | | | | | | | | | | |
| 4 | ↓ | A4 | | | | | | | | | | | | |
| 5 | ↓ | ↓ | | | | | | | | | | | | |
| 6 | ↓ | ↓ | | | | | | | | | | | | |
| 7 | ↓ | ↓ | | | | | | | | | | | | |
| 8 | ↓ | ↓ | A7 | | | | | | | | | | | |
| 9 | ↓ | ↓ | ↓ | | | | | | | | | | | |
| 10 | ↓ | ↓ | ↓ | A1 | | | | | | | | | | |
| 11 | A10 | ↓ | ↓ | ↓ | | | | | | | | | | |
| 12 | ↓ | ↓ | ↓ | | | A1 | | | | | | | | |
| 13 | ↓ | ↓ | ↓ | A4 | | ↓ | | | | | | | | |
| 14 | ↓ | A13 | ↓ | ↓ | | ↓ | | | | | | | | |
| 15 | ↓ | ↓ | ↓ | ↓ | | ↓ | A4 | | | | | | | |
| 16 | ↓ | ↓ | ↓ | A7 | | ↓ | ↓ | | | | | | | |
| 17 | ↓ | ↓ | A16 | ↓ | | ↓ | ↓ | | | | | | | |
| 18 | ↓ | ↓ | ↓ | ↓ | | ↓ | ↓ | A7 | | | | | | |
| 19 | ↓ | ↓ | ↓ | A10 | | ↓ | ↓ | ↓ | | | | | | |
| 20 | A19 | ↓ | ↓ | ↓ | | ↓ | ↓ | ↓ | | | | | | |
| 21 | ↓ | ↓ | ↓ | | | ↓ | ↓ | ↓ | A10 | | | | | |
| 22 | ↓ | | ↓ | A13 | | ↓ | ↓ | ↓ | ↓ | | | | | |
| 23 | ↓ | A22 | ↓ | ↓ | | ↓ | ↓ | ↓ | ↓ | A1 | | | | |
| 24 | ↓ | ↓ | ↓ | | | A13 | ↓ | ↓ | ↓ | ↓ | | | | |
| 25 | ↓ | ↓ | | A16 | | ↓ | ↓ | ↓ | ↓ | ↓ | | | A1 | |
| 26 | ↓ | ↓ | A25 | ↓ | | ↓ | ↓ | ↓ | ↓ | A4 | | | | |
| 27 | ↓ | ↓ | ↓ | | | ↓ | A16 | ↓ | ↓ | ↓ | | | | |
| 28 | | ↓ | ↓ | A19 | | ↓ | ↓ | ↓ | ↓ | ↓ | | | | A4 |
| 29 | | ↓ | ↓ | ↓ | | ↓ | ↓ | ↓ | ↓ | A7 | | | | |
| 30 | | ↓ | ↓ | | | ↓ | ↓ | A19 | ↓ | ↓ | | | | |
| 31 | | | ↓ | A22 | | ↓ | ↓ | ↓ | ↓ | ↓ | | | A7 | |
| 32 | | | ↓ | ↓ | | ↓ | ↓ | ↓ | ↓ | A10 | | | | |
| 33 | | | ↓ | | | ↓ | ↓ | ↓ | A22 | ↓ | | | | |
| 34 | | | | A25 | | ↓ | ↓ | ↓ | ↓ | ↓ | | | | A10 |
| 35 | | | | ↓ | | ↓ | ↓ | ↓ | ↓ | A13 | | | | |
| 36 | | | | | | A25 | ↓ | ↓ | ↓ | ↓ | | | | |
| 37 | | | | | | ↓ | ↓ | ↓ | ↓ | ↓ | | | A13 | |
| 38 | | | | | | ↓ | | ↓ | ↓ | A16 | | | | |
| 39 | | | | | | ↓ | | ↓ | ↓ | ↓ | | | | |
| 40 | | | | | | ↓ | | ↓ | ↓ | ↓ | | | | A16 |
| 41 | | | | | | ↓ | | | ↓ | A19 | | | | |
| 42 | | | | | | ↓ | | | ↓ | ↓ | | | | |
| 43 | | | | | | ↓ | | | ↓ | ↓ | | | A19 | |
| 44 | | | | | | ↓ | | | | A22 | | | | |
| 45 | | | | | | ↓ | | | | ↓ | | | | |
| 46 | | | | | | ↓ | | | | | | | | A22 |
| 47 | | | | | | | | | | A25 | | | | |
| 48 | | | | | | | | | | ↓ | | | | |
| 49 | | | | | | | | | | | | | A25 | |
| 50 | | | | | | | | | | | | | | |
| 51 | | | | | | | | | | | | | | |

FIG. 19 E3
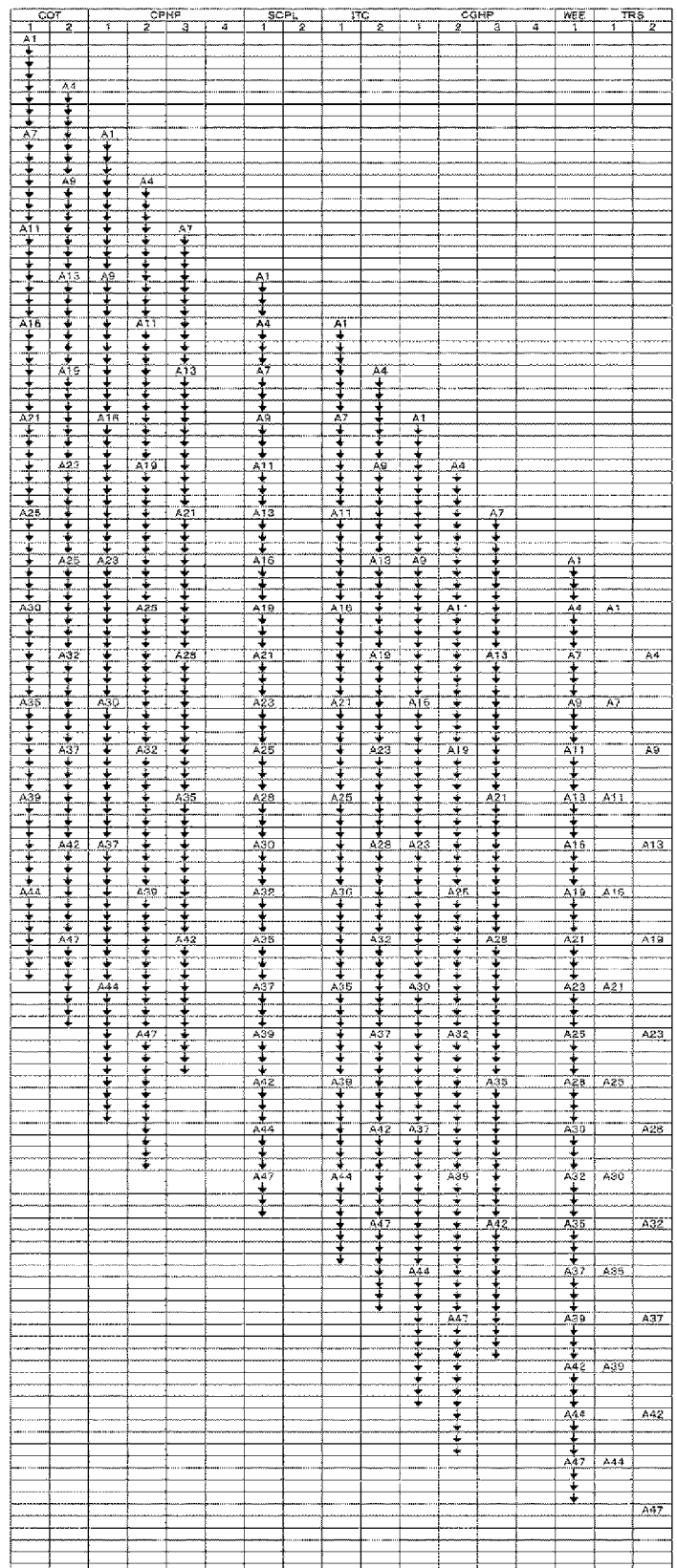

SUBSTRATE PROCESSING APPARATUS AND SUBSTRATE PROCESSING METHOD

CROSS-REFERENCE TO RELATED APPLICATIONS

This application is based on and claims priority from Japanese Patent Application Nos. 2019-012412 and 2019-139113 filed on Jan. 28, 2019 and Jul. 29, 2019, respectively, with the Japan Patent Office, the disclosures of which are incorporated herein in their entireties by reference.

TECHNICAL FIELD

Embodiments disclosed herein relate to a substrate processing apparatus and a substrate processing method.

BACKGROUND

In the process of manufacturing semiconductor devices, photolithography is performed on a semiconductor wafer which is a substrate (hereinafter, referred to as a wafer). A substrate processing apparatus for performing the photolithography may be configured such that a transfer mechanism transfers wafers in an order with respect to a plurality of processing modules that perform different processes. Further, a plurality of identical processing modules may be provided to perform the same processing on the wafers of the same lot in parallel.

Japanese Patent Laid-Open Publication No. 2010-147424 discloses an applying and developing apparatus in which a processing block is configured in the manner that a plurality of unit blocks is stacked, and each unit block is provided with processing modules that perform different processings on a wafer and processing modules that perform the same processing on wafers as described above. In the applying and developing apparatus, relatively longer one of the maximum value of values obtained by dividing a processing time in each processing module by the number of processing modules that perform the same processing and the shortest time when a substrate transfer mechanism moves around once in a unit block becomes a time when the substrate transfer mechanism moves around once in a unit block (cycle time). Based on the cycle time and a processing time of a heating module included in a processing module, the number of stay cycles of a wafer in the heating module (the number of times of the moving-around operation of the substrate transfer mechanism) is determined, and a transfer schedule of wafers in a unit block is set.

SUMMARY

According to the present disclosure, a substrate processing apparatus including; a processing block in which a substrate is sequentially transferred from an upstream-side module to a downstream-side module and processed; a carry-in/out transfer mechanism including a transfer arm configured to deliver the substrate between a carrier in which the substrate is stored and the processing block, thereby carrying-in/out the substrate with respect to modules of the processing block; a carry-out module configured to place the substrate therein after the substrate is processed such that the substrate is carried out from the processing block by the carry-in/out transfer mechanism; a multi-module configured by a plurality of modules provided on an upstream side of the carry-out module and having a same order in which the substrate is transferred in the processing block; a main transfer mechanism including a plurality of substrate holders that independently move forward/backward with respect to each module, and configured to move around in a transfer path provided in the processing block to deliver the substrate among the modules; and a controller configured to set a first transfer schedule including a determination of a number of modules to become transfer destinations of the substrate in the multi-module, and a determination of a number of stay cycles which is a number of times that the main transfer mechanism moves around after the substrate is carried into the multi-module until the substrate is carried out, based on: a time parameter which is a substrate transfer time that corresponds to a number of transfer processes of the main transfer mechanism which is required to transfer the substrate carried into the processing block to the carry-out module, or a maximum time of times obtained for a plurality of steps included in a processing in a manner that among a module group including the multi-module and provided in the processing block to perform the processing on the substrate, a required stay time of the substrate in a module of a same step is divided by a number of usable modules in the step, the required stay time of the substrate in a module constituting the multi-module, and a cycle time which is a time when the main transfer mechanism moves around once in the transfer path.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 4 is a table view illustrating a transfer schedule of a comparative example.

FIG. 5 is a table view illustrating a transfer schedule of an embodiment.

FIG. 7 is a table view illustrating a transfer schedule of a comparative example.

FIG. 8 is a table view illustrating a transfer schedule of a comparative example.

FIG. 9 is a table view illustrating a transfer schedule of an embodiment.

FIG. 10 is a table view illustrating a transfer schedule of an embodiment.

FIG. 14 is a table view illustrating a transfer schedule of an embodiment.

FIG. 15 is a table view illustrating a transfer schedule of an embodiment.

FIG. 16 is a table view illustrating a transfer schedule of an embodiment.

FIG. 18 is a table view illustrating a transfer schedule of an embodiment.

FIG. 19 is a table view illustrating a transfer schedule of an embodiment.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Figure 1:
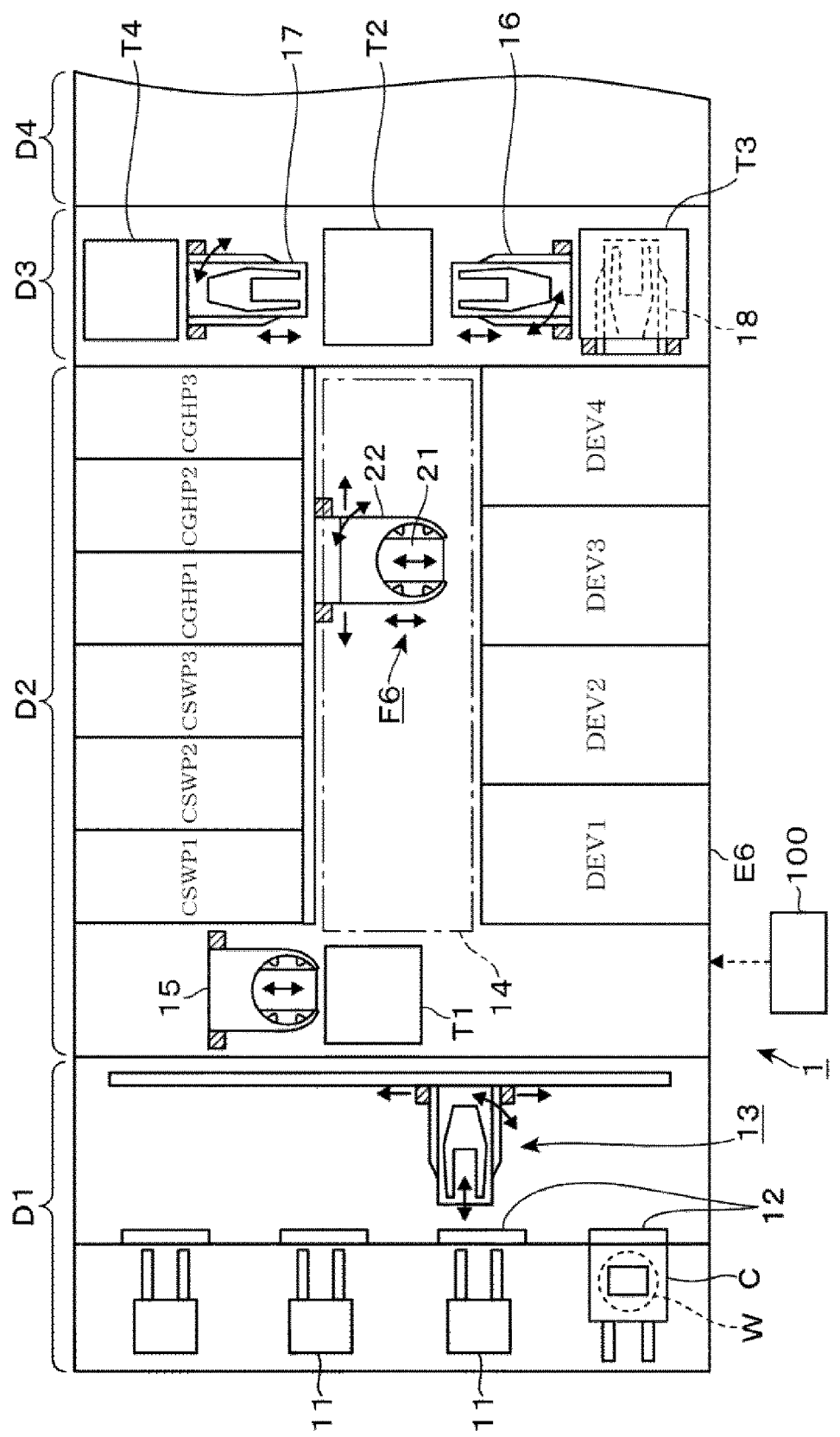
FIG. 1 is a horizontal cross-sectional side view of an applying and developing apparatus according to an embodiment of the present disclosure.
Figure 2:
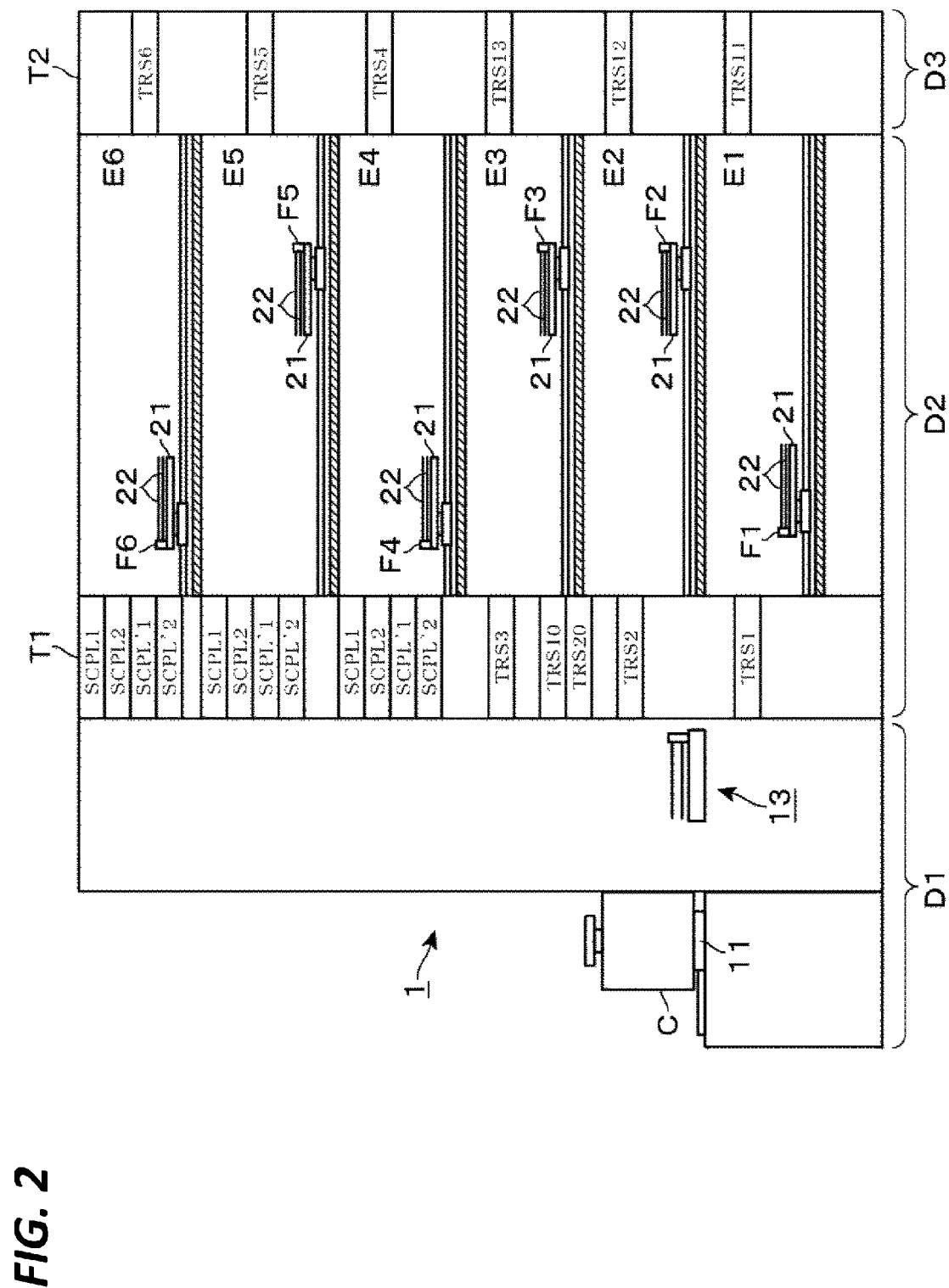
FIG. 2 is a vertical cross-sectional side view of the applying and developing apparatus.

An applying and developing apparatus 1 which is an embodiment of a substrate processing apparatus of the present disclosure will be described with reference to the plan view of FIG. 1 and the vertical cross-sectional side view of FIG. 2. The applying and developing apparatus 1 is configured such that a carrier block D1, a processing block D2, and an interface block D3 are participated from each other and connected to each other in this order from the front toward the rear of the applying and developing apparatus 1. An exposure machine D4 is connected to the rear of the interface block D3. The carrier block D1 is provided with a mounting table 11 of a carrier 10 that stores a plurality of wafers W, an opening/closing unit 12, and a transfer mechanism 13 that transfers wafers W from the carrier 10 via the opening/closing unit 12.

The processing block D2 is configured such that unit blocks E1 to E6 that perform a liquid processing and a heating processing on a wafer W are stacked in an order from the bottom of the applying and developing apparatus 1, and the unit blocks E1 to E6 are partitioned from each other. In this example, the unit blocks E1 to E3 have the same configuration and each form an antireflection film by an application of a chemical liquid and a resist film by an application of a resist, as the liquid processing. In addition, the unit blocks E4 to E6 have the same configuration and each form a resist pattern by a development, as the liquid processing. In the respective unit blocks E (E1 to E6), wafers W are transferred and processed in parallel with each other.

Descriptions will be made on the unit block E6 illustrated in FIG. 1 as a representative of the unit blocks E1 to E6. A transfer path 14 is formed at the center of the unit block E6 in the left-and-right direction to extend in the front-and-rear direction. Four development modules are provided at one of the left and right sides of the transfer path 14, and represented as DEV1 to DEV4, respectively. A plurality of heating modules are provided at the other side of the transfer path 14 to be arranged in the front-and-rear direction, and each provided with a hot plate for heating a wafer W placed thereon. The temperature of the hot plate, that is, the heating temperature of a wafer W may be changed. As the heating modules, CSWP1 to CSWP3 are provided to perform a PEB (post exposure bake) which is a heat processing after an exposure and before a development, and CGHP1 to CGHP3 are provided to perform a heating processing after a development.

In the transfer path 14, a transfer arm F6 is provided to transfer wafers W in the unit block E6. The transfer arm F6 includes a base 21 that is movable up and down, movable frontward and rearward, and movable rotatably around a vertical axis. Two substrate holders 22 are provided on the base 21 and are able to support wafers W, respectively. The substrate holders 22 may independently move forward and backward with respect to a module. As described later, when a wafer W is transferred to a module on the downstream side of a transfer flow, one substrate holder 22 may move backward to receive a wafer W from the module, and the other substrate holder 22 may subsequently move forward the module to send a held wafer W out to the module. That is, wafers W may be transferred in a manner of being exchanged in a module, and this transfer will be referred to as an exchange transfer. In addition, a module refers to a place where a wafer W is to be placed, and a module that performs a processing on a wafer W may be described as a processing module.

Descriptions will be made on the unit blocks E1 to E3, focusing on differences from the unit block E6. Each of the unit blocks E1 to E3 includes an antireflection film formation module and a resist film formation module, instead of the development modules DEV (DEV1 to DEV4). The resist film formation module supplies a resist as a chemical liquid to a wafer W, so as to form a resist film. The antireflection film formation module supplies a chemical liquid for forming an antireflection film to a wafer W, so as to form an antireflection film. Further, each of the unit blocks E1 to E3 includes a heating module that heats each of the wafer W after the formation of the antireflection film and the wafer W after the formation of the resist film, instead of the heating modules CSWP (CSWP1 to CSWP3) and CGHP (CGHP1 to CGHP3). In FIG. 2, the transfer arms of the respective unit blocks E1 to E5 that each correspond to the transfer arm F6 are represented as F1 to F5, and the transfer arms F1 to F6 that serve as main transfer mechanisms have the same configuration.

A tower T1 is provided in the side of the processing block D2 close to the carrier block D1. The tower T1 extends vertically across the respective unit blocks E1 to E6 and includes a plurality of modules stacked on each other. The tower T1 is provided with delivery modules TRS10, TRS20, and TRS1 to TRS3 and temperature adjustment modules SCPL1, SCPL2, SCPL'1, and SCPL'2.

The delivery modules TRS1 to TRS3 are provided at heights accessible by the transfer arms F1 to F3, respectively. The temperature adjustment modules SCPL (SCPL1 and SCPL2) and SCPL' (SCPL'1 and SCPL'2) are provided at heights accessible by the transfer arms F4 to F6, respectively. The temperature adjustment modules SCPL and SCPL' are each provided with a stage for cooling a placed wafer W to adjust the temperature of the wafer W. The SCPL is a temperature adjustment module to which a wafer W is transferred subsequent to the heating module CSWP, and the SCPL' is a temperature adjustment module to which a wafer W is transferred subsequent to the heating module CGHP. The temperature adjustment module SCPL' is a carry-out module that places thereon wafers W processed in the unit blocks E4 to E6 in order to carry the wafers W out from the unit blocks E4 to E6. In addition, a transfer mechanism 15 is provided in the vicinity of the tower T1 to be accessible to each module constituting the tower T1 and movable up and down.

Next, the interface block D3 will be described. The interface block D3 is provided with towers T2 to T4 that extend vertically across the unit blocks E1 to E6. In the tower T2, a plurality of delivery modules TRS are stacked. The delivery modules TRS are provided at heights that correspond to the unit blocks E1 to E6, respectively. The delivery modules at the heights that correspond to the unit blocks E1 to E3 are represented as TRS11 to TRS13, respectively, and the delivery modules at the heights that correspond to the unit blocks E4 to E6 are represented as TRS4 to TRS6, respectively. The delivery modules TRS4 to TRS6 are carry-in modules that carry wafers W into the unit blocks E4 to E6, respectively.

The towers T3 and T4 are provided such that the tower T2 is sandwiched between the towers T3 and T4 in the left-and-right direction. While the towers T3 and T4 include various modules, illustration and descriptions of the modules will be omitted. Further, the interface block D3 is provided with transfer mechanisms 16 to 18 that transfer wafers W with respect to the towers T2 to T4. The transfer mechanism 16 is movable up and down to deliver wafers W with respect to the towers T2 and T3, and the transfer mechanism 17 is movable up and down to deliver wafers W with respect to the towers T2 and T4. The transfer mechanism 18 delivers wafers W between the tower T2 and the exposure machine D4. The transfer mechanisms 13, 15, and 16 to 18 constitute carry-in/out transfer mechanisms that deliver wafers W between the carrier 10 and the processing block D2.

Next, the transfer flow of wafers W in the applying and developing apparatus 1 will be described. Wafers W are transferred from a carrier 10 to the delivery module TRS10 of the tower T1 by the transfer mechanism 13. The wafers W are allocated from the delivery module TRS10 to the delivery modules TRS1 to TRS3 by the transfer mechanism 15. Then, the wafers W are carried into the unit blocks E1 to E3 from the delivery modules TRS1 to TRS3 by the transfer arms F1 to F3, and each transferred along an order of the antireflection film formation module→the heating module→the resist film formation module→the heating module. As a result, after an antireflection film and a resist film are sequentially formed on each of the wafers W, the wafers W are transferred to the delivery modules TRS11 to TRS13, and transferred to the exposure unit D4 by the transfer mechanisms 16 and 18 such that the resist film is exposed along a predetermined pattern.

The exposed wafers W are taken out from the exposure machine D4 by the transfer mechanism 18, and received by the transfer mechanism 17 through the modules of the tower T4. The transfer mechanism 17 repeatedly transfers the wafers W to the delivery modules TRS4, TRS5, and TRS6 in this order, to allocate the wafers W to the delivery modules. Then, the wafers W transferred to the delivery modules TRS4 to TRS6 are transferred by the transfer arms F4 to F6 along an order of the heating module CSWP→the temperature adjustment module SCPL→the development module DEV→the heating module CGHP→the temperature adjustment module SCPL'. As a result, a PEB, a temperature adjustment, a development, and a temperature adjustment are performed in this order on the resist film formed on each wafer W. Then, the wafers W are carried out from the unit blocks E4 to E6 by the transfer mechanism 15, transferred to the delivery module TRS20, and returned to the carrier 10 by the transfer mechanism 13.

Meanwhile, when the wafers W are transferred as described above, a plurality of modules having the same transfer order in the unit block E are defined as a multi-module. Accordingly, the development modules DEV1 to DEV4 constitute the same multi-module, the temperature adjustment modules SCPL1 and SCPL2 constitute the same multi-module, and the temperature adjustment modules SCPL'1 and SCPL'2 constitute the same multi-module. Further, the heating modules CSWP1 to CSWP3 constitute the same multi-module, and the heating modules CGHP1 to CGHP3 constitute the same multi-module. In addition, each processing process in the transfer flow described above may be described as a step. That is, the respective modules that constitute the same multi-module perform the same step. In addition, since the transfer flow is set as described above, the heating module CSWP and the temperature adjustment module SCPL correspond to upstream-side multi-modules, and the development module DEV and the heating module CGHP correspond to downstream-side multi-modules.

In addition, a wafer W transferred in the applying and developing apparatus 1 is set with a process job PJ. The PJ refers to information that specifies a processing recipe on a wafer W (including a transfer recipe specifying a module type to which a wafer W is to be transferred for processing) and a wafer W to be transferred. Wafers W set with the same PJ are wafers W of the same lot that are subjected to the same kind of processing. By the processing recipe, the number of usable modules or processing contents are specified, and a processing time of a wafer W in each module is calculated based on the processing contents. Further, various calculations are performed based on the processing recipe, so that an overhead time (OHT) to be described later is calculated. In addition, the processing contents (processing parameters) include the temperatures of the hot plates in the heating modules CSWP1 to CSWP3 and CGHP1 to CGHP3.

Descriptions will be made on each parameter specified in the processing recipe or calculated based on the processing recipe. The number of usable modules refers to the number of modules that constitute the same multi-module and are usable when wafers W are processed. In the following description, it is assumed that all the modules described above are used for processing wafers W of each PJ. Accordingly, for example, since the development module DEV includes the four development modules DEV1 to DEV4, the number of usable modules in DEV is 4. In addition, the OHT refers to the sum of a time required after a wafer W is carried into a module and before the wafer W is processed, and a time required after the wafer W is processed and before the wafer W becomes a state of being able to be carried out from the module. Meanwhile, the sum of a processing time of the wafer W in the module and the OHT is an at least required stay time when the wafer W stays in the module (module using time (MUT)). Based on the processing recipe described above, the processing time and the OHT of a wafer W are calculated, and the MUT is also calculated.

For example, wafers W of different lots are stored in different carriers 10, and when carry-out of wafers W from one carrier 10 is ended, carry-out of wafers W from the next carrier 10 is performed. In the applying and developing apparatus 1, wafers W carried into the apparatus are transferred in an order toward the downstream side. That is, the transfer is performed such that a relatively lately carried-in wafer W is suppressed from moving toward a downstream-side module ahead of a relatively early carried-in wafer W. Accordingly, wafers W of the same lot, that is, wafers W of the same PJ are collectively carried into each unit block E.

The transfer arm F (F1 to F6) cyclically moves among modules to be accessed in the unit block E (E1 to E6) in an order, so as to perform a cycle transfer for transferring wafers W one by one from an upstream-side module to a downstream-side module. That is, for the unit block E6, the transfer arm F6 repeatedly moves around in the transfer path 14, such that the transfer of a wafer W is repeatedly performed from the side of the delivery module TRS6 which is a carry-in module into the unit block E6 toward the side of the temperature adjustment module SCPL' which is a carry-out module. The time when the transfer arm F moves around once in the transfer path 14 will be referred to as a cycle time. Then, a transfer schedule is prepared by sequentially arranging data that specifies a cycle by the transfer arm F in association with an order allocated to a wafer W and a module of a transfer destination. A wafer W is transferred in the applying and developing apparatus 1 according to the transfer schedule that is prepared in advance before the wafer W is carried into the applying and developing apparatus 1.

Figure 3:
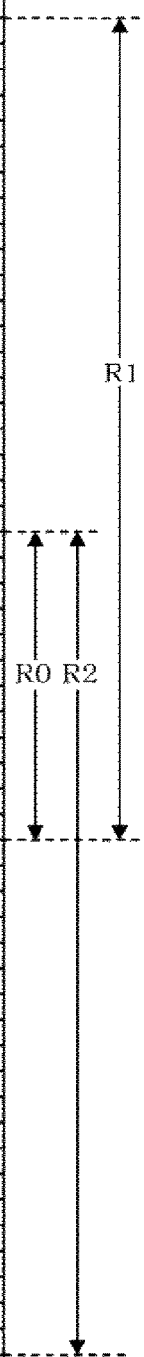
FIG. 3 is a table view illustrating a transfer schedule of a comparative example.

Hereinafter, in order to describe the transfer schedule and a setting method thereof in the applying and developing apparatus 1, a transfer schedule of a comparative example will be first described. The table of FIG. 3 represents a transfer schedule of Comparative Example 1 which is set in a case where wafers W of PJ-A which is a first lot and wafers W of PJ-B which is a second lot are consecutively transferred in this order by the transfer arm F6. The transfer schedule represented as the table will be described. One row of horizontally arranged cells represents one cycle, and cycles are relatively late in time toward the bottom of the table. A column of vertically arranged cells represents a module of a transfer destination of wafers W. An ID number written in a cell and an arrow extending downward from the ID number indicate a cycle in which a wafer W is transferred and stays, a module to/in which a wafer W is transferred and stays, and a wafer W to be transferred and stay.

Specifically, in terms of time series, a wafer W is transferred to a module in a cycle corresponding to a cell with an ID number, and in a cycle corresponding to a cell with an arrow, the wafer W stays in the module from the beginning to the end of the cycle. Then, in a cycle corresponding to a cell with no arrow immediately below the cell with the arrow, the wafer W is carried out from the module. In addition, the number of cycles in which a wafer W stays in a module will be referred to as the number of stay cycles of the wafer W in the module. Specifically, in the transfer schedule table, the number of cells each having an ID number (=1)+the number of cells each having an arrow below the cell having an ID number=the number of stay cycles. For example, in FIG. 3, since two cells each having an arrow are arranged below a cell having an ID number for the heating module CSWP, the number of stay cycles in the heating module CSWP is 3.

As for the ID numbers denoted by A01 to A20 and B01 to B20, an alphabet indicates PJ set for wafers W, and a number indicates an order in which each wafer W of one PJ is carried into the unit block E6. Accordingly, the transfer schedule represents an example where 20 wafers W for each of PJ-A and PJ-B are transferred. In the following description, each wafer W may be referred to using an ID number.

Tables 1 and 2 below represent parameters set for each module of the unit block E6, with respect to PJ-A and PJ-B, respectively.

TABLE 1

| PJ-A | CSWP | SCPL | DEV | CGHP | SCPL' |
|---|---|---|---|---|---|
| Number of Usable Modules | 3 | 2 | 4 | 3 | 2 |
| Processing Time | 24.0 sec | 20.0 sec | 40.0 sec | 21.0 sec | 10.0 sec |
| OHT | 12.0 sec | 2.5 sec | 7.0 sec | 12.0 sec | 9.0 sec |
| MUT | 36.0 sec | 22.5 sec | 47.0 sec | 33.0 sec | 19.0 sec |

TABLE 2

| PJ-B | CSWP | SCPL | DEV | CGHP | SCPL' |
|---|---|---|---|---|---|
| Number of Usable Modules | 3 | 2 | 4 | 3 | 2 |
| Processing Time | 35.0 sec | 20.0 sec | 65.0 sec | 35.0 sec | 10.0 sec |

TABLE 2-continued

| PJ-B | CSWP | SCPL | DEV | CGHP | SCPL' |
|---|---|---|---|---|---|
| OHT | 12.0 sec | 2.5 sec | 7.0 sec | 12.0 sec | 9.0 sec |
| MUT | 47.0 sec | 22.5 sec | 72.0 sec | 47.0 sec | 19.0 sec |

Hereinafter, descriptions will be made on a rule applied to the setting of the transfer schedule of Comparative Example 1. In Comparative Example 1, the number of stay cycles of a wafer W in each module constituting a multi-module is the same as the number of usable modules constituting the multi-module, for both PJ-A and PJ-B. Accordingly, for PJ-A and PJ-B, the numbers of stay cycles of CSWP, SCPL, DEV, and CGHP are 3, 2, 4, and 3, respectively. In addition, the transfer schedules illustrated in FIG. 3 and each drawing to be described later represent the operation of the transfer arm F6. The transfer arm F6 performs only carry-in of a wafer W with respect to SCPL' which is a carry-out module from the unit block E6, and another transfer mechanism performs carry-out of a wafer W from SCPL'. Thus, the number of stay cycles of SCPL' is 1 since only a cycle required for the carry-in with respect to SCPL' is counted.

In addition, in Comparative Example 1, wafers W are repeatedly transferred with respect to modules constituting the same multi-module along a predetermined order. Further, when one cycle includes only one PJ, the cycle time is set to a cycle time corresponding to the PJ, and when one cycle includes a plurality of PJs, the cycle time is set to a cycle time corresponding to the slowest PJ. While a method of calculating the cycle time will be described later, the cycle time of PJ-A is 12 seconds, and the cycle time of PJ-B is 18 seconds. Accordingly, in a time period R0 when both the wafers W of PJ-A and the wafers W of PJ-B are carried into the unit block E6, the cycle time of each cycle is set to 18 seconds which is the cycle time of PJ-B.

The setting of the transfer schedule according to the rule described above is intended to increase the number of times that the exchange transfer is performed with respect to each module on the upstream side of SCPL' which is a carry-out module. As described above, according to the exchange transfer, carry-in and carry-out of wafers W are performed with respect to one module. Thus, as the number of times of the exchange transfer increases, the movement of the transfer arm F6 among modules is suppressed so that the number of operation processes of the transfer arm F6 may be reduced. Further, as a result of the reduction in the number of operation processes of the transfer arm F6, the rate of the series of processing in the unit block E6 is suppressed from being restricted by the operation of the transfer arm F6, and hence, the reduction of throughput of the unit block E6 is suppressed. Further, the transfer schedule table is displayed according to the rule described above, and hence, when the table represents that with respect to one module, a wafer W is carried-in in a certain cycle, and another wafer W stays in a cycle immediately before (previous to) the certain cycle, the wafers W are subjected to the exchange transfer.

As apparent from FIG. 3, in the transfer schedule of Comparative Example 1, the exchange transfer is performed when the transfer arm F6 accesses each module of CSWP, SCPL, DEV, and CGHP second and subsequent times. In addition, the number of times that the transfer arm F6 accesses each of CSWP, SCPL, DEV, CGHP, and SCPL' in one cycle is suppressed to 1 or lower. That is, the number of operation processes of the transfer arm F6 is suppressed.

Meanwhile, in the transfer schedule of Comparative Example 1, as described above, the number of stay cycles of a wafer W in a module constituting a multi-module=the number of usable modules in the multi-module. Accordingly, when the number of usable modules is large, the time when a wafer W waits in the module after the wafer W becomes a state of being able to be carried out from the module becomes relatively long. Further, as described above, when one cycle includes a plurality of PJs, the cycle time is set to a cycle time of a relatively slower PJ. Hence, the transfer time of a wafer W that may be originally transferred in a relatively short cycle time is delayed. Specifically, while the transfer interval of the wafers W of PJ-A to SCPL' which is the exit of the unit block E6 is 12 seconds before the time period R0, the transfer interval is 18 seconds in the time period R0 as described above. As a result, the throughput of the wafers W of PJ-A is reduced in the time period R0. Further, when the time period from a cycle in which a first wafer W of one PJ is transferred to CSWP to a cycle in which the last wafer W of the PJ is transferred to SCPL' is defined as a stay time period of the PJ, a stay time period R1 of PJ-A is 456 seconds, and a stay time period R2 of PJ-B is 576 seconds, in Comparative Example 1.

A review is performed on setting a transfer schedule which obtains a higher throughput than that of the transfer schedule of Comparative Example 1 described above. In order to obtain the relatively high throughput, the cycle time of each cycle is set to, for example, the shortest cycle time of the cycle times of the respective PJs of wafers W transferred to the unit block E6. Then, the number of stay cycles of a wafer W in each step of the transfer flow is set to a value of MUT/cycle time (a decimal value is rounded up to an integer). FIG. 4 represents the transfer schedule of PJ-A and PJ-B which is prepared according to the rule described above, as a transfer schedule of Comparative Example 2.

The transfer schedule of Comparative Example 2 will be described, focusing on differences from the transfer schedule of Comparative Example 1. It is assumed that the shortest cycle time of the cycle times of the respective PJs of wafers W transferred to the applying and developing apparatus 1 is the cycle time of PJ-A. Thus, in Comparative Example 2, the cycle time of each cycle is set to 12 seconds which is the cycle time of PJ-A according to the rule described above.

In addition, as the number of stay cycles is set according to the above-described rule in Comparative Example 1, the numbers of stay cycles of CSWP, SCPL, DEV, and CGHP are set to 3, 2, 4, and 3, respectively, for the wafers W of PJ-A in Comparative Example 2. However, for the wafers W of PJ-B, the numbers of stay cycles of CSWP, SCPL, DEV, and CGHP are set to 4, 2, 6, and 4, respectively. Specifically, the number of stay cycles of the wafers W of PJ-B in CSWP is calculated as MUT (47.0 sec)/cycle time (12 sec)=3.9, and when the decimal value is rounded up, the number of stay cycles is 4. Accordingly, in Comparative Example 2, the numbers of stay cycles of PJ-A and PJ-B in each module are different from each other. As a result, in Comparative Example 1, the wafer B01 is carried into SCPL' which is the exit of the unit block E6 in each cycle, in a cycle subsequent to the cycle in which the wafer A20 is carried into SCPL', and in Comparative Example 2, the wafer B01 is carried into SCPL' after several cycles from the carry-in of the wafer A20. In addition, in Comparative Example 2, a setting is performed such that wafers W are transferred with respect to respective modules constituting a multi-module according to the same predetermined order as that in Comparative Example 1.

In Comparative Example 2, the cycle times of the PJs are set to be constant as described above, and the transfer schedule is set for the wafers W of each PJ such that a wafer W stays in a module as much as the required number of stay cycles which is calculated according to the cycle time. As a result, the time after the wafer W becomes a state of being able to be carried-out from the module and before the wafer W is carried-out is suppressed from becoming long.

However, in Comparative Example 2, since the cycle time and the number of stay cycles are set as described above, there occurs a step where the number of stay cycles>the number of usable modules. Due to the step, there occurs a case where the exchange transfer is not performed in the other steps within the unit block E6. Specifically, in the development module DEV, the number of stay cycles of PJ-B=6, and the number of usable modules=4. Hence, the number of stay cycles>the number of usable modules. Further, since the exchange transfer is performed in the development module DEV, there occurs a case where the exchange transfer is not performed in CSWP, SCPL, and CGHP. When the exchange transfer is not performed, the number of operation processes of the transfer arm F6 increases as described above.

Specifically, the operation of the transfer arm F6 in a cycle C1 illustrated in FIG. 4 will be described. The transfer arm F6 receives the wafer B05 and sends out the wafer B08 with respect to the heating module CSWP1. Subsequently, the transfer arm F6 sends out the wafer B05 but receives no wafer W with respect to the temperature adjustment module SCPL1. Subsequently, the transfer arm F6 receives the wafer B04 and sends out no wafer W with respect to the temperature adjustment module SCPL2. Then, the transfer arm F6 sends out the wafer B04 and receives no wafer W with respect to the temperature adjustment module DEV4. Then, the transfer arm F6 receives the wafer A19 and sends out no wafer W with respect to the heating module CGHP1. Then, the transfer arm F6 sends out the wafer A19 to the temperature adjustment module SCPL'1. In this way, the transfer arm F6 delivers wafers W with respect to both SCPL1 and SCPL2 in one cycle. That is, the cycle C1 becomes a cycle in which the number of operation processes of the transfer arm F6 is large, as compared with the cycle of Comparative Example 1. As illustrated, in addition to the cycle C1, there exist cycles in which the number of operation processes of the transfer arm F6 is large as in the cycle C1.

A transfer schedule of Embodiment 1 illustrated in FIG. 5 is set such that the number of times of transfer which is not the exchange transfer may be reduced. In the transfer schedule of Embodiment 1, the cycle time and the number of stay cycles are determined in the same manner as that in the transfer schedule of Comparative Example 2. However, in the transfer schedule of Embodiment 1, a transfer destination of a wafer W in a multi-module is set according to a rule different from that in Comparative Example 2.

Hereinafter, the rule for determining a transfer destination of a wafer W in Embodiment 1 will be described. In Embodiment 1, a module of a transfer destination of a wafer W is determined from a plurality of modules constituting a multi-module, according to an order in which each wafer W is carried into the unit block E6. To determine a transfer destination, first, in a cycle where a wafer W of which transfer destination is to be determined is transferred to the multi-module (referred to as a reference cycle for the convenience of description), the number of modules to which the wafer W can be transferred among the usable modules of the multi-module is determined. That is, it is determined how many modules exist unoccupied by wafers W, when a wafer W is transferred in the reference cycle. As a result of the determination, when there exists only one module to which a wafer W can be transferred, among the modules of the multi-module, the corresponding module is determined to be a transfer destination.

Meanwhile, when it is determined that there exist a plurality of modules to which a wafer W can be transferred in the multi-module, it is determined which of the modules to which the wafer W can be transferred is a module from which a wafer W transferred to the module earlier than the wafer W of which transfer destination is to be determined is carried out in a cycle closest to the reference cycle. The cycle closest to the reference cycle includes the reference cycle. Then, the module determined as a module from which the wafer W transferred earlier is carried out in the closest cycle is determined to be a transfer destination of the wafer W of which transfer destination is to be determined. A transfer destination of each wafer W of PJ-A and PJ-B is determined for each multi-module according to the rule described above.

For example, detailed descriptions will be made on a process of determining a transfer destination of the wafer B04 when transfer destinations of wafers W are determined in an order of the wafers A01 . . . , and A20 and B01 . . . , and B20, in SCPL (SCPL1, SCPL2). In FIG. 5, a cycle in which the wafer B04 is transferred to SCPL is indicated as C2, and in this example, the cycle C2 is the reference cycle described above. As represented in the transfer schedule table, the wafer B02 is carried out from SCPL1 in the cycle immediately before the cycle C2, and the wafer B03 is carried out from SCPL2 in the cycle C2. Accordingly, the wafer B04 may be transferred to any one of SCPL1 and SCPL2. When viewed from the cycle C2, the cycle in which the wafer W is carried out from SCPL2 is close to and the same as the cycle C2, as compared with the cycle in which the wafer W is carried-out from SCPL1. Thus, SCPL2 is determined to be the transfer destination of the wafer B04.

In the transfer schedule of Embodiment 1 (second transfer schedule), the stay time period R1 of PJ-A is 384 seconds, and the stay time period R2 of PJ-B is 540 seconds. Thus, upon comparing the transfer schedules of Embodiment 1 and Comparative Example 1 with each other, both the stay time periods R1 and R2 in the transfer schedule of Embodiment 1 are shorter than those in the transfer schedule of Comparative Example 1. Further, upon comparing the transfer schedules of Embodiment 1 and Comparative Example 2 with each other, the stay time period R1 of PJ-A and the stay time period R2 of PJ-B in the transfer schedule of Embodiment 1 are the same as those in the transfer schedule of Comparative Example 2. However, since transfer destinations of wafers W are set as described above in Embodiment 1, it is apparent from the comparison between FIGS. 4 and 5 that the number of times of the exchange transfer in the transfer schedule of Embodiment 1 is larger than that in the transfer schedule of Comparative Example 2. Accordingly, in the transfer schedule of Embodiment 1, the load of the transfer arm F6 is suppressed, so that the throughput in the unit block E6 may be improved.

However, FIG. 5 described above is the transfer schedule table set in a case where the temperatures of the hot plates in the heating module CGHP (temperatures for heating wafers W) are the same for PJ-A and PJ-B. Hereinafter, descriptions will be made on a case where the temperatures of the hot plates in the heating module CGHP are different for PJ-A and PJ-B. In this case, a different rule (referred to as an exception rule) from the rule described in FIG. 5 (referred to as a normal rule) is applied to the wafers W of PJ-B which are counted from the first one to amount to the number of usable modules of the heating module CGHP, and transfer destinations of the wafers W are determined among CGHP1 to CGHP3. Since the number of usable modules of the heating module CGHP is 3, the exception rule is applied to the three wafers B01 to B03. In addition, the normal rule is applied to the wafers W of PJ-A and the wafers W of PJ-B other than the wafers B01 to B03, to determine transfer destinations.

The exception rule will be described, focusing on differences from the normal rule. When a cycle in which a wafer W of which transfer destination is to be determined is transferred to a multi-module is defined as a reference cycle, it is determined which of modules of the multi-module is a module from which a wafer W previously transferred to the module is carried out in a cycle farthest (away in time) from the reference cycle. Then, the module determined as a module from which the previously transferred wafer W is carried out in the farthest cycle is determined to be a transfer destination of the wafer W of which transfer destination is to be determined.

Figure 6:
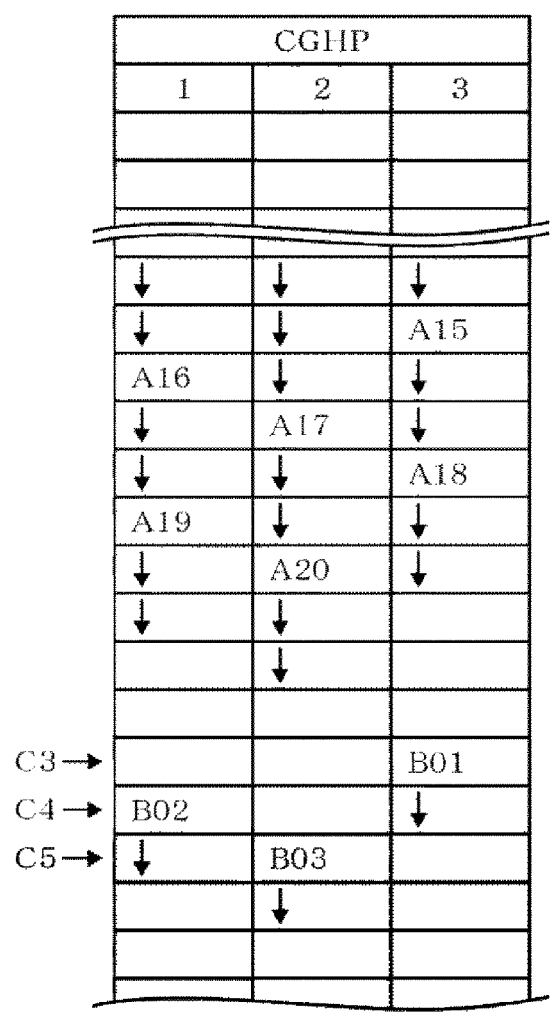
FIG. 6 is a table view illustrating a transfer schedule of an embodiment.

Descriptions will be made on a process of determining transfer destinations of the wafers B01 to B03 by applying the exception rule, with reference to FIG. 6. In addition, for the convenience of description, FIG. 6 represents that the number of stay cycles of PJ-B in CGHP is 2. Further, cycles in which the wafers B01, B02, and B03 are transferred to CGHP are represented as C3, C4, and C5, respectively. That is, the cycles C3 to C5 are reference cycles for determining transfer destinations of the wafers B01 to B03.

First, a transfer destination of the wafer B01 is determined. From the table of FIG. 6, the wafer B01 may be transferred to any of CGHP1 to CGHP3. However, the wafer W (A18) is carried out from CGHP3 among CGHP1 to CGHP3 in the cycle farthest from the cycle C3. Accordingly, CGHP3 is determined to be a transfer destination of the wafer B01. Next, a transfer destination of the wafer B02 is determined. The wafer B02 may be transferred to either CGHP1 or CGHP2. However, the wafer W (A19) is carried out from CGHP1 in the cycle farthest from the cycle C4. Accordingly, CGHP1 is determined to be a transfer destination of the wafer B02. Subsequently, a transfer destination of the wafer B03 is determined. The wafer B03 may be transferred to either CGHP2 or CGHP3. However, the wafer W (A20) is carried out from CGHP2 in the cycle farthest from the cycle C5. Accordingly, CGHP2 is determined to be a transfer destination of the wafer B03.

For additional descriptions of the exception rule, as described above, a module of a multi-module from which a wafer W previously transferred to the module is carried out in a cycle farthest from a reference cycle is determined to be a transfer destination. The wafer W carried out from a module refers to a wafer W carried out from each module in a cycle closest to each reference cycle. Accordingly, in the transfer schedule of FIG. 6, while the wafers A15 to A17 are carried out from CGHP1 to CGHP3 before the wafers A18 to A20, the transfer destinations of the wafers B01 to B03 are determined based on the carry-out status of the wafers A18 to A20 as described above.

Transferring the wafers B01 to B03 according to the exception rule is intended to correct and stabilize the temperatures of the hot plates during the time period after the processing of the wafers W of PJ-A in the heating module CGHP is ended and before the wafers W of PJ-B are transferred. Further, the exception rule is also identically applied to a case where the temperatures of the hot plates of the heating modules CSWP differ between PJ-A and PJ-B, so as to determine transfer destinations of wafers W.

In addition, another example of setting a transfer schedule will be described. In setting a transfer schedule to be described herein below, it is assumed that the transfer mechanism 17 that transfers wafers W to the delivery modules TRS4 to TRS6 which are carry-in modules into the unit blocks operates in synchronization with the cycle times of the unit blocks E4 to E6. Specifically, the transfer mechanism 17 repeatedly transfers wafers W in an order, to the delivery modules TRS4 to TRS6 as described above, and transfers one wafer W every cycle time. That is, one wafer W is transferred to each of the unit blocks E4 to E6 every three cycles. For the convenience of description, Table 3 below represents parameter values different from the parameter values represented in Table 1 above, for PJ-A. For PJ-A represented in Table 3, it is assumed that the cycle time is 12 seconds which is the same as that of PJ-A represented in Table 1 and is the shortest among the PJs of wafers W transferred to the unit block E6.

TABLE 3

| PJ-A | CSWP | SCPL | DEV | CGHP | SCPL' |
|---|---|---|---|---|---|
| Number of Usable Modules | 9 | 6 | 12 | 9 | 6 |
| Processing Time | 75.0 sec | 20.0 sec | 120.0 sec | 10.0 sec | 20.0 sec |
| OHT | 12.0 sec | 2.5 sec | 7.0 sec | 12.0 sec | 8.0 sec |
| MUT | 87.0 sec | 22.5 sec | 127.0 sec | 22.0 sec | 28.0 sec |

By using the cycle time, the number of stay cycles in each module is determined according to the same rule as that in Comparative Example 2. It is assumed that the calculations described above are performed, and the numbers of stay cycles of CSWP, SCPL, DEV, CGHP, and SCPL' for PJ-A of Table 3 are 8, 2, 11, 2, and 1, respectively. The calculated numbers of stay cycles are the uncorrected numbers of stay cycles. FIG. 7 is a transfer schedule of PJ-A in the unit block E6, which is set using the uncorrected numbers of stay cycles such that wafers W are transferred to respective modules constituting a multi-module according to the same predetermined order as that in Comparative Examples 1 and 2. This transfer schedule is a transfer schedule of Comparative Example 3.

As illustrated in FIG. 7, the transfer schedule of Comparative Example 3 is set such that a relatively large number of transfers that are not the exchange transfers are performed. Thus, a correction of the number of stay cycles is performed for each module on the upstream side of SCPL' which is a carry-out module. Assuming that a wafer W is transferred to the unit block E6 once every N cycles (N is an integer), the correction is made such that a corrected value is equal to or larger than a value of the uncorrected number of stay cycles, is an integral multiple of N, and is as small as possible. As described above, in this example, N=3. Accordingly, 8, 2, 11, and 2 which are the uncorrected numbers of stay cycles for CSWP, SCPL, DEV, and CGHP, respectively, are corrected to 9, 3, 12, and 3, respectively.

Figure 8:
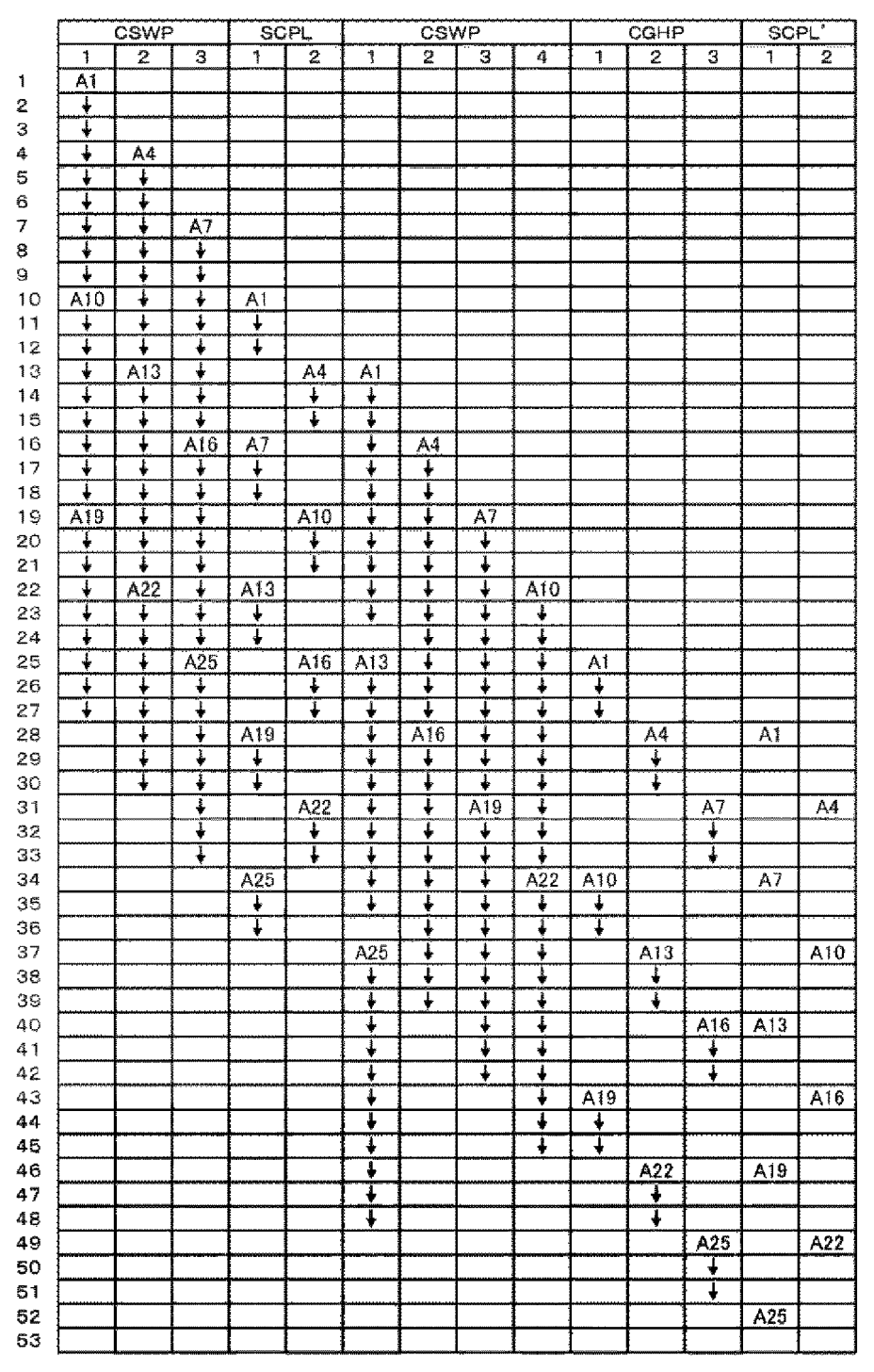

FIG. 8 is a transfer schedule of PJ-A which is set using the corrected numbers of stay cycles as described above, and is a transfer schedule of Comparative Example 4. The transfer schedule of Comparative Example 4 is set such that wafers W are transferred to transfer destinations of modules constituting a multi-module according to the same predetermined order as that in Comparative Examples 1 to 3. As apparent from FIGS. 7 and 8, since the number of times that the exchange transfer is performed in the transfer schedule of Comparative Example 4 is larger than that in the transfer schedule of Comparative Example 3, the throughput of the unit block E6 may be improved, as compared to Comparative Example 3.

After the numbers of stay cycles are corrected as in Comparative Example 4, a transfer schedule is set by determining transfer destinations of wafers W using the normal rule and the exception rule described in Embodiment 1. That is, a transfer schedule is set along the procedures of calculating the number of stay cycles, correcting the calculated number of stay cycles, and determining transfer destinations of wafers W. FIG. 9 is a transfer schedule of PJ-A set along the procedures, and is a transfer schedule of Embodiment 2. As apparent from FIGS. 8 and 9, since the number of times that the exchange transfer is performed in the transfer schedule of Embodiment 2 is larger than that in the transfer schedule of Comparative Example 4, the throughput of the unit block E6 may be improved. In addition, the unit blocks E4 to E6 have the same configuration as described above. Accordingly, since the same transfer schedule as that of the unit block E6 is set for the unit blocks E4 and E5, the throughput of the unit blocks E4 to E6 may be improved.

FIG. 10 is a transfer schedule of PJ-A of Table 3 in which transfer destinations of wafers W are set according to the rule described in Embodiment 1 without correcting the numbers of stay cycles, and is a transfer schedule of Embodiment 3. That is, the transfer schedule of Embodiment 3 is set along the procedures of calculating the number of stay cycles and determining transfer destinations of wafers W. Upon comparing the transfer schedules of Embodiments 2 and 3 with each other, the number of times that the exchange transfer is performed in the transfer schedule of Embodiment 2 is relatively large. Accordingly, it is relatively preferable to set a transfer schedule along the procedures of calculating the number of stay cycles, correcting the calculated number of stay cycles, and determining transfer destinations of wafers W as in Embodiment 2. In addition, while Embodiments 2 and 3 represent the transfer schedules only for the wafers W of PJ-A, it is assumed that transfer schedules for the wafers W of the other PJ as well are set as in Embodiment 1.

Referring back to FIG. 1, the controller 100 provided in the applying and developing apparatus 1 will be described. The controller 100 is a computer, and a program stored in a storage medium such as a compact disk, a hard disk, a memory card or a DVD is installed in the controller 100. A control signal is output to each unit of the applying and developing apparatus 1 by the installed program. Thus, an instruction (each step) is incorporated in the program, so as to perform the above-described transfer and processing of wafers W. Then, the program sets a transfer schedule along the same procedures as those for setting the transfer schedule of Embodiment 2 in FIG. 9. Accordingly, the program performs each determination for setting the transfer schedule described in each of the embodiments and the comparative examples.

Further, the controller 100 includes a data receiver and a memory. For example, the data receiver is connected to a host computer that controls the transfer of wafers W to the applying and developing apparatus 1. Then, the data receiver receives information on wafers W sequentially transferred to the applying and developing apparatus 1, from the host computer. The memory stores various data to generate the PJs described above based on the acquired information and to specify the processing recipe and wafers W to be transferred as described above. Further, the memory stores, for example, a cycle time commonly used for the transfer of each PJ in advance. That is, the memory stores various types of information necessary for setting a transfer schedule described above in the embodiments.

Figure 11:
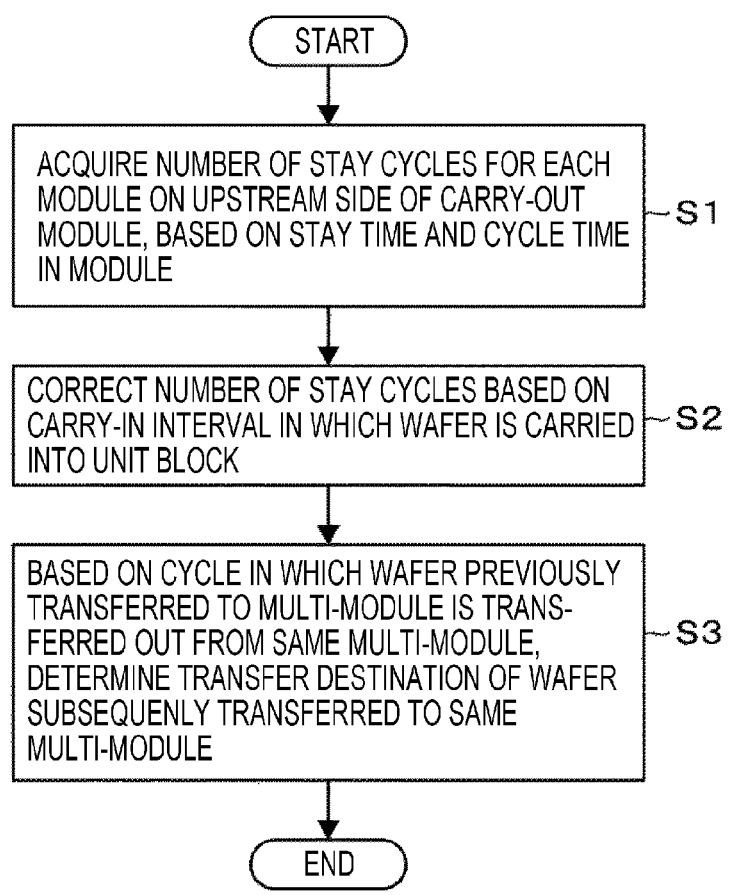
FIG. 11 is a chart view illustrating a setting flow of a transfer schedule of an embodiment.

FIG. 11 illustrates a flow of the setting of a transfer schedule of the unit block E6 by the controller 100 described above. First, information on each PJ of wafers W to be transferred to the unit block E6 is acquired. Then, as described in detail in Comparative Example 2, the numbers of stay cycles of CSWP, SCPL, DEV, and CGHP are calculated for each PJ, based on the MUT (processing time+OHT) defined by the PJ and the cycle time stored in the memory (step S1).

Subsequently, a correction is performed to each of the calculated numbers of stay cycles, based on the carry-in interval in which the wafers W are carried into the unit block E6 as described in detail in Comparative Example 3 (step S2). Then, as described in detail in Embodiment 1, transfer destinations are determined for the wafers W carried into the unit block E6 in an order, using the corrected numbers of stay cycles and the above-described normal rule and exception rule. That is, based on a cycle in which a wafer W previously carried into a multi-module is carried out from the multi-module, a transfer destination of a wafer W to be transferred to the multi-module relatively later is determined. In this way, a transfer destination of each wafer W in the multi-module is determined, and a transfer schedule is set (step S3). After the transfer schedule is set, the wafers W of each PJ are transferred and processed based on the transfer schedule.

According to the applying and developing apparatus 1 described above, a transfer schedule is set as described along the above-described flow. According to the transfer schedule, a wafer W is suppressed from staying in a module for a long time after the wafer W becomes a state of being able to be carried out from the module, and a large number of exchange transfers are performed so that the loads of the transfer arms F4 to F6 are suppressed. As a result, the throughput of the unit blocks E4 to E6 may be improved. In addition, in the applying and developing apparatus 1, the transfer schedule of Embodiment 2 is set. However, the transfer schedules of the other embodiments may be set. Accordingly, while the correction to the numbers of stay cycles in step S2 of the flow of FIG. 11 may not be performed, the correction may be performed in order to reliably improve the throughput as described above.

Meanwhile, in the unit block E6, an exposure module including a light irradiation unit may be provided as a multi-module to be stacked on, for example, the heating modules CSWP and CGHP. The light irradiation unit irradiates the entire resist film on the surface of a wafer W with light. The exposure module exposes the resist film on the surface of an undeveloped wafer W after PEB. As a result of the exposure by the exposure module, only a portion of the resist film which is exposed by the exposure machine D4 is altered when the sum of supplied exposure energy exceeds a reference value, so that a resist pattern is formed at the time of development. The intensity of light irradiation to a wafer W by the light irradiation unit of the exposure module may be changed.

Then, the intensity of light irradiation by the light irradiation unit is also included as a processing parameter specified by each PJ. In addition, it is assumed that as illustrated in FIG. 5 and others, the wafers W of PJ-A and the wafers W of PJ-B are consecutively transferred to the unit block E6, and the intensity of light irradiation differs between PJ-A and PJ-B. That is, it is assumed that the exposure module changes the intensity of light irradiation after the processing of the wafers W of PJ-A and before the processing of the wafers W of PJ-B. In that case, the exception rule is identically applied, as in the case where the temperatures of the hot plates are changed between PJs, such that a transfer destination of each wafer W of PJ-B may be determined from the plurality of exposure modules. A transfer destination is determined in this way, so that the intensity of light irradiation is changed, and the wafers W of PJ-B may be processed in the stable state.

That is, the controller 100 may be configured such that when different values are set between PJs for predetermined parameters of the processing parameters such as the temperatures of the hot plates and the intensity of light irradiation, the exception rule described above is applied to determine transfer destinations of wafers W. In addition, the exposure module may expose only a peripheral edge portion of an undeveloped wafer W, in order to remove an unnecessary resist film.

Meanwhile, a cycle time corresponding to each PJ is set as described in Comparative Example 1 where the cycle time of PJ-A is 12 seconds and the cycle time of PJ-B is 18 seconds. The cycle time is determined such that the transfer arm F may access a multi-module which is a bottleneck of the throughput of the unit block E, once in one cycle. More specifically, a division value is obtained by dividing the MUT by the number of usable modules for each module, and a value equal to or larger than the maximum value of the obtained division values is set as a cycle time.

Specifically, in Table 1 above, the division values of PJ-A are 36.0 sec/3=12.0 seconds for CSWP and 22.5 sec/2=11.25 seconds for SCPL, 47.0 sec/4=11.75 seconds for DEV, 33.0 sec/3=11.0 seconds for CGHP, and 19.0 sec/2=9.5 seconds for SCPL'. Accordingly, the maximum value of the obtained division values is 12.0 seconds of CSWP, which is set as the cycle time of PJ-A.

Further, in Table 2 above, the division values of PJ-B are 47.0 sec/3=15.66 seconds for CSWP, 22.5 sec/2=11.25 seconds for SCPL, and 72.0 sec/4=18.0 seconds for DEV, 47.0 sec/3=15.6 seconds for CGHP, and 19.0 sec/2=9.5 seconds for CGHP. The maximum value of the obtained division values is 18.0 seconds of DEV, which is set as the cycle time of PJ-B.

In this way, a cycle time may be calculated based on the above-described processing recipe and the parameters specified in the processing recipe. Accordingly, the present disclosure is not limited to storing the minimum value of the cycle times of the PJs expected to be transferred to the applying and developing apparatus 1, in the memory of the controller 100 in advance. That is, the present disclosure is not limited to storing a cycle time in the memory at the time when the apparatus is started. After the apparatus is started, the controller 100 that has received information of each PJ of wafers W to be transferred to the apparatus may calculate a cycle time from each PJ, and select the minimum value of the calculated cycle times, so as to set a transfer schedule. In addition, it is preferable to use a relatively smaller one of the cycle time obtained from one PJ and the cycle time obtained from the other PJ, for setting a transfer schedule. That is, the present disclosure is not limited to using the minimum cycle time of cycle times obtained from a plurality of PJs, for setting a transfer schedule.

In addition, a multi-module may be provided in, for example, the tower T2 of the interface block D3, and when the multi-module is installed in that place, the installation place of the multi-module is also included in the processing block. That is, a multi-module is provided in a range accessible by the transfer arm F, and the place where the multi-module is provided is included in the processing block.

Meanwhile, the present disclosure is not limited to being applied to the setting of the transfer schedules of the unit blocks E4 to E6, and for example, may be applied to the setting of the transfer schedules of the unit blocks E1 to E3. The number of unit blocks is not also limited to the number described above, and the processing block may not be divided into the plurality of unit blocks. In addition, the modules mounted in the processing block are not limited to the examples described above, and accordingly, the substrate processing apparatus of the present disclosure is not limited to being configured as the applying and developing apparatus 1. For example, the substrate processing apparatus of the present disclosure may be configured such that the processing block is provided with, for example, a module that applies a chemical liquid for forming an insulating film, a module that supplies a cleaning liquid for cleaning a wafer W, and a module that supplies an adhesive for bonding wafers W to each other.

In addition, while various examples of setting a cycle time CT have been described, the present disclosure is not limited to the examples. For example, in the applying and developing apparatus 1, a CT corresponding to a certain PJ expected to be relatively frequently specified may be used as a common CT for setting a transfer schedule of the wafers W of each PJ. That is, in setting a common CT for the plurality of PJs, the present disclosure is not limited to selecting a relatively shorter CT of the CTs corresponding to the PJs specified in the applying and developing apparatus 1 so as to set a transfer schedule.

Meanwhile, in the applying and developing apparatus 1, the unit blocks E1 to E3 have the same configuration as that of the unit blocks E4 to E6, except that the types of modules mounted in the unit blocks E1 to E3 are different from those in the unit blocks E4 to E6. In addition, the unit blocks E1 to E3 have the same configuration, so as to perform the same processing on wafers W. In the example illustrated in FIG. 12, it is assumed that each of the unit blocks E1 to E3 is provided with a temperature adjustment module SCPL, a resist film formation module COT, a heating module CGHP, a peripheral edge exposure module WES, and a delivery module TRS, and wafers W is transferred to the modules in this order. Further, it is assumed that one unit block is provided with two temperature adjustment modules SCPL and two resist film formation modules COT, three heating modules CGHP, one peripheral edge exposure module WES, and one delivery module TRS. Further, it assumed that the MUT is 28 seconds for the temperature adjustment module SCPL, 67.1 seconds for the resist film forming module COT, 77.0 seconds for the heating module CGHP, and 18.0 seconds for the peripheral edge exposure module WES.

A value obtained by dividing the MUT of a module in the same step by the total number of usable modules throughout the unit blocks is defined as a MUT cycle time MUTCT. When no unusable module exists, the MUTCT is 28.0 sec/6≈4.67 seconds for SCPL, 67.1 sec/6≈11.18 seconds for COT, 77.0 sec/9≈8.56 seconds for CGHP, and 18.0 sec/3≈6.0 seconds for WES. Among the MUTCTs, 11.18 seconds of COT is the maximum value (maximum time). Accordingly, the rate of the throughput of the unit blocks E1 to E3 is restricted by the processing in COT, as long as an arm cycle time which is a substrate transfer time to be described later is not taken into account.

Meanwhile, when the number of transfer processes (arm processes) of the transfer arms F1 to F3 in the unit blocks E1 to E3 is large, the rate of the throughput of the unit blocks E1 to E3 is restricted by the transfer operations of wafers W by the transfer arms F1 to F3, rather than the processing in the module. The number of arm processes refers to the number of processes of the transfer arm F which is required to transfer a substrate carried into the processing block (unit block) to the carry-out module of the processing block (unit block). In this example, since a wafer W is transferred among the five modules of SCPL (carry-in module)→COT→CGHP→WES→TRS (carry-out module), the number of arm processes is 4 which is the number of spaces among the modules. It is assumed that a time required for one arm process is predetermined and is, for example, 3.7 seconds. Then, when the arm cycle time (ACT)=the number of arm processes×setting time÷the number of corresponding stacked unit blocks, the ACT of each of the unit blocks E1 to E3 is 4×3.7÷3≈4.9 seconds. In this way, the ACT corresponds to the number of transfer processes of the transfer arm F and the number N of stacked unit blocks that perform the same processing on wafers W (N is an integer).

Upon comparing the maximum value of the MUTCT and the ACT with each other, in this example, 11.18 seconds which is the maximum value of the MUTCT is larger than 9.2 seconds of the ACT. Accordingly, in this example, the rate of the productivity of the unit blocks E1 to E3 is restricted by the processing in the resist film formation module COT, rather than the operations of the transfer arms F1 to F3. In this way, the maximum value of the MUTCT and the ACT are compared with each other, and relatively larger one is set as a block cycle time (block CT). Thus, in this example, 11.18 seconds which is the MUTCT of COT is the block CT. That is, the block CT is related to the blocks through which wafers W pass (unit blocks E1 to E3 here), and is a time parameter for one of a module and a transfer arm which requires the longest time in a cycle in which a wafer W is processed.

Meanwhile, since the unit blocks E1 to E3 have the same configuration as described above, the throughput becomes the highest when wafers W are carried-in such that the ratio of the number of wafers W to be carried-in is the same among the unit blocks E1 to E3, as long as no unusable module exists. However, it is assumed that an unusable module occurs. In that case, it is conceived that the controller 100 changes the ratio of the number of wafers W to be carried-in among the unit blocks E1 to E3, to correspond to the number of usable modules. Specifically, for example, assuming that one CGHP of the unit block E3 becomes unusable so that the total number of the modules CGHP throughout the unit blocks E1 to E3 becomes 8, it is conceived to change the number of wafers W to be carried-in, to the unit blocks E1:E2:E3=3:3:2.

However, even though one CGHP becomes unusable, the MUTCT of CGHP is 77.0 sec/8≈9.63 seconds which is smaller than 11.18 seconds of the MUTCT of COT. That is, no change occurs in the block CT, and the throughput of the unit blocks E1 to E3 is still affected by COT. Accordingly, it is not appropriate to change the ratio of the number of wafers W to be carried-in according to the number of the modules CGHP, and the change reduces the throughput of the unit blocks E1 to E3. Later, descriptions will be made on Embodiment 5 in which the ratio of the number of wafers W to be carried-in is appropriately set among the unit blocks E1 to E3.

Embodiment 4

Subsequently, descriptions will be made on Embodiment 4 in which the number of stay cycles in each multi-module is set along a procedure using the block CT described above in order to perform the exchange transfer in a multi-module of each step, focusing on differences from the foregoing embodiments. Embodiment 4 represents the above-described method of setting the transfer schedule of PJ-A and PJ-B in the unit block E6. As the outline of Embodiment 4, the number of modules used in a multi-module of each step is determined to be the required number of modules which needs to be the relatively smaller number of modules without deteriorating the throughput of the unit block E6. Then, based on the determined required number of modules, the number of stay cycles of a wafer W in a module of each step is determined.

It is assumed that the cycle time CT is 12 seconds, and the block CT of each of PJ-A and PJ-B is 18.5 seconds. Tables 4 and 5 below represent parameters for PJ-A and PJ-B, respectively. Hereinafter, descriptions will be made on methods of calculating the required number of stay cycles, the required number of modules, a correction value, and the number of stay cycles described in the tables. In addition, unlike Embodiment 5 in which wafers W are transferred in each of the unit blocks E4 to E6 having the same configuration, Embodiment 4 is an example of setting a transfer schedule in a case where wafers W are transferred in only E6 of the unit blocks E4 to E6.

TABLE 4

| PJ-A | CSWP | SCPL | DEV | CGHP | SCPL' |
|---|---|---|---|---|---|
| Number of Usable Modules | 3 | 2 | 4 | 3 | 2 |
| Processing Time | 24.0 sec | 20.0 sec | 40.0 sec | 21.0 sec | 10.0 sec |
| OHT | 12.0 sec | 2.5 sec | 7.0 sec | 12.0 sec | 9.0 sec |
| MUT | 36.0 sec | 22.5 sec | 47.0 sec | 33.0 sec | 19.0 sec |
| Required Number of Stay Cycles | 3 | 2 | 4 | 3 | |
| Required Number of Modules | 2 | 2 | 3 | 2 | |
| Correction Value | 2 | 1 | 2 | 2 | |
| Number of Stay Cycles | 4 | 4 | 6 | 4 | 1 |

TABLE 5

| PJ-B | CSWP | SCPL | DEV | CGHP | SCPL' |
|---|---|---|---|---|---|
| Number of Usable Modules | 3 | 2 | 4 | 3 | 2 |
| Processing Time | 24.0 sec | 20.0 sec | 40.0 sec | 21.0 sec | 10.0 sec |
| OHT | 12.0 sec | 2.5 sec | 7.0 sec | 12.0 sec | 9.0 sec |
| MUT | 47.0 sec | 22.5 sec | 67.0 sec | 47.0 sec | 19.0 sec |
| Required Number of Stay Cycles | 4 | 2 | 6 | 4 | |
| Required Number of Modules | 3 | 2 | 4 | 3 | |
| Correction Value | 2 | 1 | 2 | 2 | |
| Number of Stay Cycles | 6 | 4 | 8 | 6 | 1 |

Figure 13:
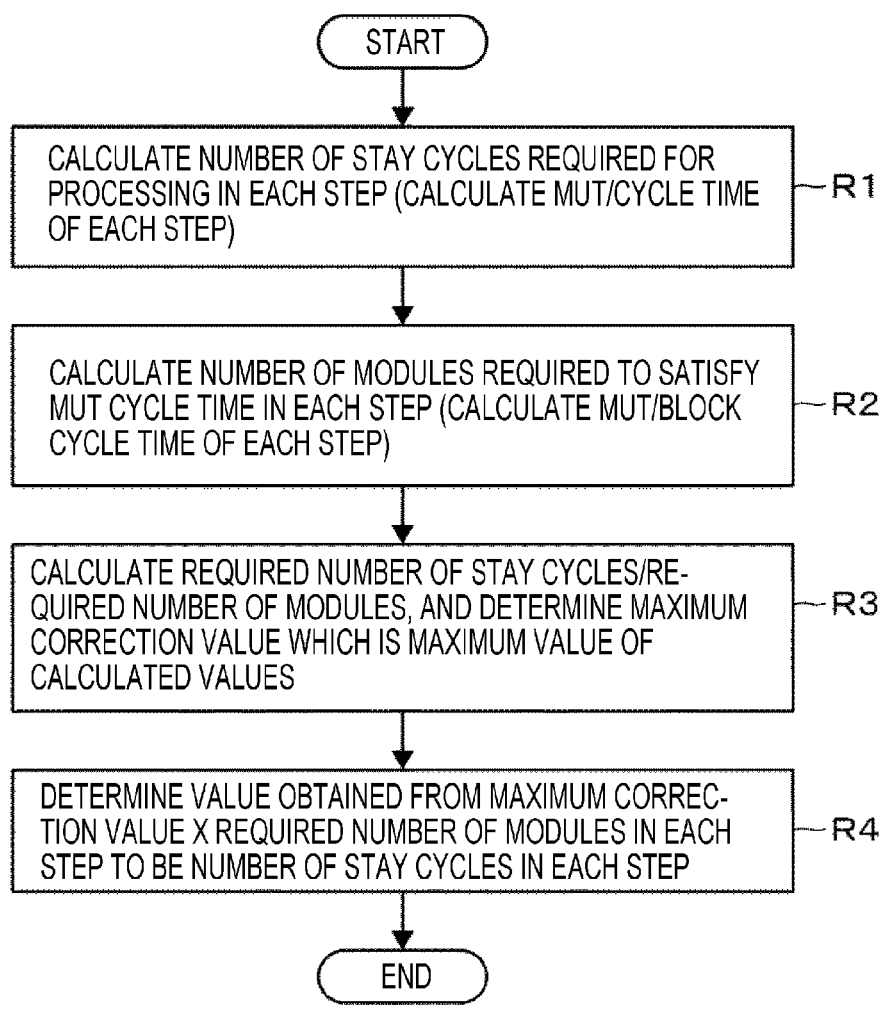
FIG. 13 is a flowchart illustrating a procedure of setting the number of stay cycles for setting a transfer schedule.

Descriptions will be made with reference to FIG. 13. First, as a procedure R1, the number of stay cycles (integer value) required for processing in a module of each step is calculated. For the required number of stay cycles, MUT/CT is calculated, and when a value of a decimal place of the calculated value is not 0, the calculated value is rounded up and determined to be the required number of stay cycles. For example, the specific calculation for obtaining the required number of stay cycles for CSWP is as follows: the required number of stay cycles=36.0 sec/12 sec=3 for PJ-A; and the required number of stay cycles=47.0 sec/12 sec=3.9≈4 for PJ-B.

Then, as a procedure R2, the number of modules (integer value) required to satisfy the block CT in each step is calculated. Specifically, MUT/block CT of a module of each step is calculated, and when a value of a decimal place of the calculated value is not 0, the calculated value is rounded up and determined to be the required number of modules. That is, the procedure R2 is a procedure for determining the number of modules to be used among the usable modules, and determines the number of modules to be the smallest without changing the block CT determined from the MUTCT and the ACT.

As an example, the specific calculation for obtaining the required number of modules for CSWP is as follows: the required number of modules=36.0 sec/18.5 sec=1.9≈2 for PJ-A, and the required number of modules=47.0 sec/18.5 sec=2.5≈3 for PJ-B. The required number of modules is a value corresponding to MUT/CT (calculated value itself or value rounded up after a decimal point). In addition, unlike Embodiment 5 in which wafers W are distributed in the unit blocks E4 to E6 as described later, it is assumed in Embodiment 4 that wafers W pass through only E6 of the unit blocks E4 to E6 as described above. Accordingly, when the number of stay cycles is calculated as described later, the value calculated here is used as it is. In addition, modules to be used are determined to amount to the determined required number of modules, in an increasing order of predetermined numbers of modules constituting a multi-module. Accordingly, the determination of the required number of modules corresponds to the determination of modules to be used.

After the procedures R1 and R2 are performed, the calculation result of the procedure R1/the calculation result of the procedure R2 is calculated to obtain a correction value for a module of each step. When a value of a decimal place of the calculated value is not 0, the calculated value is rounded up, and a correction value is also calculated as an integer value. The correction value calculated in this way corresponds to the number of cycles indicating how many cycles in a module are necessary for exchanging wafers W once, in order to satisfy the above-described block CT (not to change the block CT). Then, after the correction values for the respective modules are acquired, the maximum value (maximum correction value) is selected from the acquired correction values. That is, in the modules of all of the steps, the number of cycles necessary for exchanging wafers W at least once is determined to be the maximum correction value. The series of procedures for acquiring the maximum correction value is R3.

The specific calculation for obtaining the correction value in each step for PJ-A is as follows: correction value of CSWP=3/2=1.5≈2; correction value of SCPL=2/2=1; correction value of DEV=4/3=1.3≈2; and correction value of CGHP=3/2=1.5≈2. Since the maximum value among the correction values is 2 for CSWP, DEV, and CGHP, 2 is determined to be the maximum correction value. Similarly, the specific calculation of the correction value in each step for PJ-B is as follows: correction value of CSWP=4/3≈2; correction value of SCPL=2/2=1; correction value of DEV=6/4≈2; and correction value of CGHP=4/3≈2. Since the maximum value among the correction values is 2 for CSWP, DEV, and CGHP, 2 is determined to be the maximum correction value.

Then, as a procedure R4, a calculation according to Equation 1 below is performed for a module of each step, and the calculated value according to Equation 1 is determined to be the number of stay cycles. In order to perform the exchange transfer for a certain module, the number of stay cycles needs to be set to a multiple of the required number of modules, for the module. However, by using the maximum correction value as the multiple, the number of stay cycles may be set such that the exchange transfer may be performed in the modules of all of the steps.

Maximum correction value calculated in procedure
$R3 \times$Required number of modules calculated in
procedure $R2$=Number of stay cycles      Equation 1

Specifically, for PJ-A, it is determined that the number of stay cycles of CSWP=2×2=4, the number of stay cycles of SCPL=2×2=4, the number of stay cycles of DEV=3×2=6, and the number of stay cycles of CGHP=2×2=4. Similarly, for PJ-B, it is determined that the number of stay cycles of CSWP=3×2=6, the number of stay cycles of SCPL=2×2=4, the number of stay cycles of DEV=4×2=8, and the number of stay cycles of CGHP=3×2=6.

When the required number of modules and the number of stay cycles are determined in this way, transfer destinations are allocated to the wafers W of each PJ in an increasing order of wafer numbers. When the required number of modules is two or more, that is, it is determined to use a plurality of modules, a transfer schedule is set such that wafers W are repeatedly transferred to the modules determined to be used in an order. That is, for example, when it is determined to use CSWP1 and CSWP2 of CSWP for PJ-A, a transfer schedule is set such that wafers W are transferred in an order of CSWP1, CSWP2, CSWP1, CSWP2 . . . .

Figure 14:
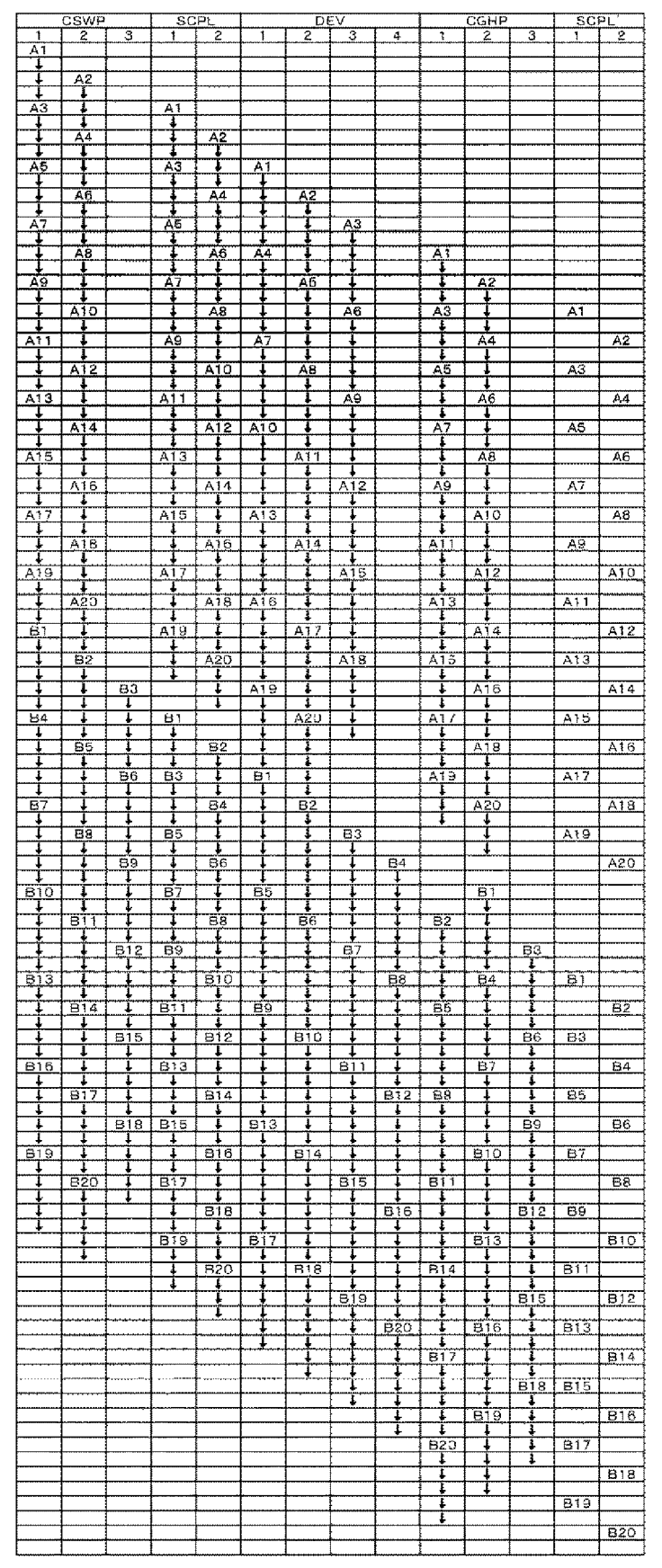

FIG. 14 illustrates a transfer schedule of PJ-A and PJ-B (first transfer schedule) in the unit block E6 which is set after the required number of modules of each step and the number of stay cycles in each step are determined as represented in Table 4. As represented in the table of the transfer schedule of FIG. 14, in the unit block E6, the exchange transfer is performed in each of CSWP, SCPL, DEV, and CGHP. Further, in the modules, the exchange transfer is performed every time a wafer W is carried out. Accordingly, when the transfer schedule is set in this way, the load of the transfer arm F6 is suppressed so that the throughput in the unit block E6 may be improved.

Embodiment 5

Subsequently, as for Embodiment 5, an example of setting a transfer schedule in the unit blocks E1 to E3 having the same configuration will be described, focusing on differences from Embodiment 4. In Embodiment 5, the ratio of the number of wafers W to be carried-in among the unit blocks E1 to E3 is appropriately set, based on the block CT, the MUT, and the number of usable modules. In Embodiment 5 as well, the procedures R1 to R4 are performed to calculate the required number of modules and the number of stay cycles such that the exchange transfer is performed in the modules of each step as in Embodiment 4.

Figure 12:
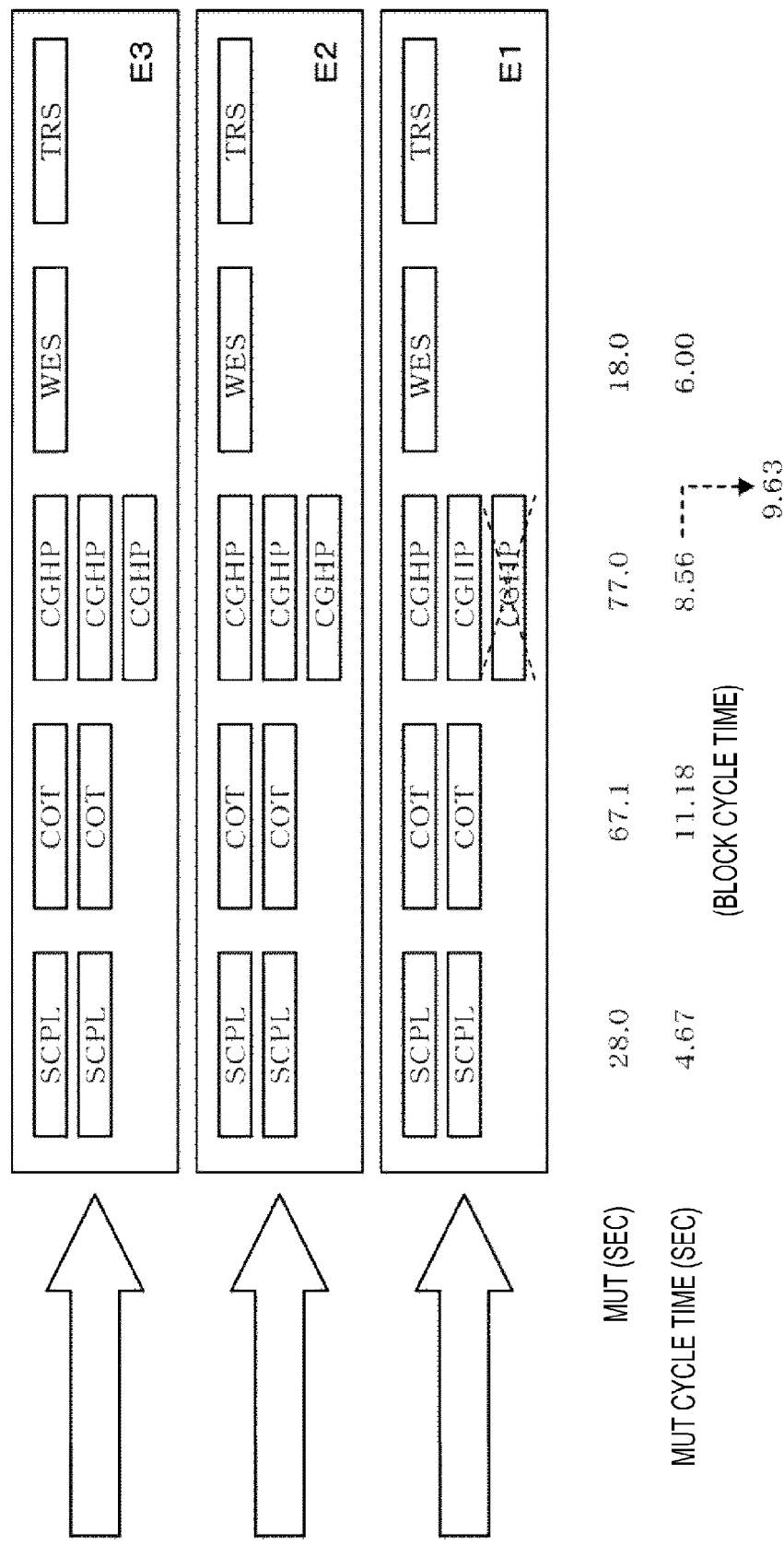
FIG. 12 is a schematic diagram illustrating unit blocks of the applying and developing apparatus.

In addition, for the convenience of description, the unit blocks E1 to E3 of Embodiment 5 include different types of module groups from those in the example illustrated in FIG. 12. Specifically, each of the unit blocks E1 to E3 is provided with a temperature adjustment module SCPL, a resist film formation module COT, a heating module CPHP, a temperature adjustment module SCPL', a chemical liquid application module ITC, a heating module CGHP, a peripheral edge exposure module WES, and a delivery module TRS, and wafers W is transferred to the modules in this order. The temperature adjustment modules SCPL and SCPL' are provided in, for example, the tower T1. The temperature adjustment module SCPL is a carry-in module for carrying wafers W into the unit blocks E1 to E3, and the wafers W are transferred by the transfer mechanism 15. That is, when the ratio of the number of wafers W to be carried-in among the unit blocks E1 to E3 is determined, the transfer by the transfer mechanism 15 to SCPL of each of the unit blocks E1 to E3 is controlled according to the determination.

The delivery module TRS is a carry-out module (exit) for carrying wafers W out from each of the unit blocks E1 to E3, and is provided in the tower T2. The chemical liquid application module ITC is a liquid processing module for applying a chemical liquid for forming a protective film that protects the resist film to a wafer W. The COT and ITC are provided at positions corresponding to the positions where DEVs are provided in each of the unit blocks E4 to E6, and CPHP, CGHP and WES are provided at positions corresponding to the positions where CSWP and CGHP are provided in each of the unit blocks E4 to E6.

The numbers of modules SCPL, COT, CPHP, SCPL', ITC, CGHP, WES, and TRS installed in one unit block is 2, 2, 4, 2, 2, 4, 1, and 2, respectively. In addition, the processing times of SCPL, COT, CPHP, SCPL', ITC, CGHP, and WES are 20.0 seconds, 55.0 seconds, 75.0 seconds, 30.0 seconds, 65.0 seconds, and 75.0 seconds, and 10.0 seconds, respectively. Further, the MUTs of SCPL, COT, CPHP, SCPL', ITC, CGHP, WES, and TRS are 28.0 seconds, 62.0 seconds, 87.0 seconds, 32.5 seconds, 72.0 seconds, and 87.0 seconds, respectively. In addition, it is assumed that the cycle time CT is set to 10 seconds.

Tables 6 and 7 below summarize the parameters that are calculated for setting transfer schedules of the unit blocks E1 to E3 in a state where CT and MUT are set as described above. In setting the transfer schedules, it is assumed that one COT of the unit block E1 and two CGHPs of the unit block E2 become unusable. That is, the number of usable COTs in the unit block E1 is 2, and the number of usable CGHPs in the unit block E2 is 2.

TABLE 6

| Modules | | SCPL | COT | CPHP | SCPL' | ITC | CGHP | WES | TRS |
|---|---|---|---|---|---|---|---|---|---|
| Number of | E1 | 2 | 1 | 4 | 2 | 2 | 4 | 1 | 2 |
| Modules | E2 | 2 | 2 | 4 | 2 | 2 | 2 | 1 | 2 |
| | E3 | 2 | 2 | 4 | 2 | 2 | 4 | 1 | 2 |
| Processing Time | | 20.0 | 55.0 | 75.0 | 30.0 | 65.0 | 75.0 | 10.0 | — |
| MUT | | 28.0 | 62.0 | 87.0 | 32.5 | 72.0 | 87.0 | 18.0 | — |
| MUTCT | | 4.7 | 12.4 | 7.3 | 5.4 | 12.0 | 8.7 | 6.0 | — |
| Required Number of Stay Cycles | | — | 7 | 9 | 4 | 8 | 9 | 2 | — |

TABLE 6-continued

| Modules | | SCPL | COT | CPHP | SCPL' | ITC | CGHP | WES | TRS | |
|---|---|---|---|---|---|---|---|---|---|---|
| Required Number of Modules | All (E1 to E3) | — | 5 | 8 | 3 | 6 | 8 | 2 | — | |
| | E1 | — | 1 | 3 | 1 | 2 | 3 | 1 | — | |
| | E2 | — | 2 | 3 | 1 | 2 | 2 | 1 | — | |
| | E3 | — | 2 | 3 | 1 | 2 | 3 | 1 | — | |
| Correction Value | E1 | — | 7 | 3 | 4 | 4 | 3 | 2 | Correction | 7 |
| | E2 | — | 4 | 3 | 4 | 4 | 5 | 2 | Value | 5 |
| | E3 | — | 4 | 3 | 4 | 4 | 3 | 2 | (Max Value) | 4 |
| Number of Stay Cycles | E1 | — | 7 | 21 | 7 | 14 | 7 | 7 | 1 | |
| | E2 | — | 10 | 15 | 5 | 10 | 5 | 5 | 1 | |
| | E3 | — | 8 | 12 | 4 | 8 | 4 | 4 | 1 | |

TABLE 7

| Stack CT | E1 | 62.00 | Carry-in Interval | 5 |
|---|---|---|---|---|
| | E2 | 43.50 | | 4 |
| | E3 | 36.00 | | 3 |

Hereinafter, a procedure of calculating each parameter described in Tables 6 and 7 will be described. The MUTCT described in FIG. 12 is calculated from the MUT and the number of usable modules. A method of calculating the MUTCT of COT and CPHP as representatives will be specifically described. For COT, the total number of usable modules in the unit blocks E1 to E3 is 1+2+2=5. Accordingly, the MUTCT of COT=62.0 sec/5=12.4 seconds. For CPHP, the total number of usable modules in the unit blocks E1 to E3 is 4+4+4=12. Accordingly, the MUTCT of CPHP=87.0 sec/12≈7.3 seconds. While the MUTCT is calculated in the same way for the other modules, the calculation of the MUTCT and the calculation of each parameter along the procedures R1 to R4 are not performed for TRS which is the exit of each unit block, because the number of stay cycles of TRS is fixed at 1, as in SCPL' of each of the unit blocks E4 to E6.

In this way, the MUTCT of each module is calculated, and the maximum value is selected from the calculated values. In this example, the MUTCT of COT is the maximum value. Then, as described above, the maximum value is compared with the ACT (arm cycle time)=the number of arm processes×set time/the number of stacked unit blocks E1 to E3=7×3.7 sec÷3=8.63 seconds. Upon the comparison, the MUTCT of COT is larger than the ACT, and thus, the MUTCT is determined to be the block CT. In addition, as described above, when the ACT which is the required time of the operation of the transfer arm is larger than the MUTCT, the ACT is determined to be the block CT.

Subsequently, as the procedure R1, the number of stay cycles required for processing in a module of each step is calculated. That is, MUT/CT is calculated. As an example, a procedure of calculating the number of stay cycles for COT and CPHP is specifically described. The required number of stay cycles of COT=62.0 sec/10 sec=6.2≈7. The required number of stay cycles of CPHP=87.0 sec/10 sec=8.7≈9. Then, as the procedure R2, the number of modules required to satisfy the MUTCT in each step is calculated. That is, MUT/block CT is calculated. As an example, a procedure of calculating the required number of modules for COT and CPHP is specifically described. The required number of modules of COT=62.0 sec/12.4 sec≈5. Further, the required number of modules of CPHP=87.0 sec/12.4 sec=7.0≈8. In addition, the required number of modules calculated in this way is the required number of modules in all of the unit blocks E1 to E3. That is, five COTs are required in all of the unit blocks E1 to E3.

The required number of modules for each of the unit blocks E1 to E3 is determined from the required number of modules for all of the unit blocks E1 to E3, based on the number of usable modules in each unit block. For a step including an unusable module, the required number of modules is determined such that all usable modules of the unit block including the unusable module are used. The shortage is determined by being equally divided between the unit blocks including no unusable module. Meanwhile, for a step including no unusable module, the required number of modules for all of the unit blocks E1 to E3 is determined by being equally divided among the unit blocks. In addition, since the number of modules is an integer, the value obtained from the equal division is rounded up when a value of a decimal place of the obtained value is not 0.

Specifically, a procedure of determining the required number of modules for COT and CPHP in each of the unit blocks E1 to E3 will be described. For COT, one COT of the unit block E1 is unusable, and the required number of modules is determined such that the other usable module COT of the unit block E1 is used. As described above, since the required number of modules for all of the unit blocks E1 to E3 is 5 for COT, the shortage is 4, and the shortage 4 is equally divided between the unit blocks E2 and E3. Thus, the required number of modules for each of the unit blocks E2 and E3 becomes 2. For CPHP, no unusable modules exist in the unit blocks E1 to E3. Since the required number of modules for all of the unit blocks E1 to E3 is 8, 8 is divided by 3 which is the number of the unit blocks E1 to E3, and as a result, a value 2.6≈3 is obtained and determined to be the required number of modules for each of the unit blocks E1 to E3. In addition, while the setting of the transfer schedule of the unit blocks E1 to E3 represented in Embodiment 5 is intended to set the operations by the transfer arms F1 to F3, the carry of wafers W into the carry-in module SCPL is performed by the transfer mechanism 15 as described above. Accordingly, the required number of modules, and a correction value and stay cycles based on the required number of modules are not calculated for the carry-in module SCPL.

Then, as the procedure R3, the calculation result of the procedure R1/the calculation result of the procedure R2 is calculated, and a correction value in each step is calculated. Since the procedure R2 calculates the required number of modules of each step for each unit block, the procedure R3 also calculates a correction value of each step for each block. As a specific example, a procedure of calculating correction values for COT and CPHP will be described. For COT, a correction value of the unit block E1=the required number of stay cycles of the unit block E1/the required number of modules of the unit block E1=7/1=7. Similarly, a correction value of each of the unit blocks E2 and E3 for COT=7/2=3.5≈4. For CPHP, a correction value of each of the unit blocks E1, E2, and E3=9/3=3.

After the correction values are calculated, the maximum value of the correction values is selected for each unit block, and determined to be the maximum correction value. In the example represented in Table 6, the correction values in the unit block E1 are 7 for COT, 3 for CPHP, 4 for SCPL', 4 for ITC, 5 for CGHP, and 2 for WES. Among the correction values, 7 of COT is the maximum value, and thus, is determined to be the maximum correction value. Similarly, the maximum correction values of the unit blocks E2 and E3 are determined to be 5 and 4, respectively.

Subsequently, as the procedure R4, the maximum correction value calculated in the procedure R3×the required number of modules calculated in the procedure R2 is calculated, so that the number of stay cycles of a wafer W in a module of each step is calculated for each unit block. Specifically, in a procedure of calculating the number of stay cycles for COT and CPHP, the number of stay cycles for COT is calculated as 7×1=7 for the unit block E1, 5×2=10 for the unit block E2, and 4×2=8 for the unit block E3. Similarly, the number of stay cycles for CPHP is calculated as 7×3=21 for the unit block E1, 5×3=15 for the unit block E2, and 4×3=12 for the unit block E3.

Further, MUT/usable modules in each step is calculated for each of the unit blocks E1 to E3, and the maximum value of the obtained values is determined to be a stack cycle time (stack CT). Then, stack CT/block CT for each of the unit blocks E1 to E3 is calculated, and when a value of a decimal place of the obtained value is not 0, the obtained value is rounded up and set as a carry-in interval in which wafers W are carried into each of the unit blocks E1 to E3. The carry-in interval to each unit block indicates the number of times that wafers W are transferred to all of the unit blocks E1 to E3 in order to transfer a wafer W once to a target unit block.

The procedure of calculating the carry-in interval will be specifically described. MUT/usable modules for each step of the unit block E1 is 62.0 sec/1 for COT, 87.0 sec/4 for CPHP, 32.5 sec/2 for SCPL', 72.0 sec/2 for ITC, 87.0 sec/4 for CGHP, and 18.0 sec/1 for WES. Accordingly, since 62.0 sec/1=62.0 seconds for COT is the maximum value, 62.0 seconds is set as the stack CT. Accordingly, since the carry-in interval is 62.0 sec/12.4 sec=5, a carry-in destination of one of 5 carries-in of wafers W in all of the unit blocks E1 to E3 is the unit block E1. That is, the carry-in interval in which wafers W are carried into the unit block E1 is calculated to be appropriate for the status where one wafer W may be processed in 62 seconds in the unit block E1, and one wafer W is processed in 12.4 seconds in view of all of the unit blocks E1 to E3.

Similarly, in the unit block E2, the stack CT=87.0 sec/2 for CGHP=43.5 seconds, and the stack CT/the block CT is 43.5 sec/12.4 sec=3.5≈4. Accordingly, a carry-in destination of one of 4 carries-in of wafers W in the unit blocks E1 to E3 is the unit block E2. In the unit block E3, the stack CT=72.0 sec/2 for ITC=36.0 seconds, and the stack CT/the block CT is 36.0 sec/12.4 sec=2.9≈3. Accordingly, a carry-in destination of one of 3 carries-in of wafers W in the unit blocks E1 to E3 is the unit block E3. In terms of the number of wafers W, the unit blocks E1:E2:E3=(5+4+3)/5:(5+4+3)/4:(5+4+3)/3=12:15:20. That is, assuming that wafers W are sequentially carried into all of the unit blocks E1 to E3 at equal intervals, the ratio of the number of wafers to be carried-in is determined such that wafers W are transferred to the unit blocks E1, E2, and E3 at the ratio of 12 wafers, 15 wafers, and 20 wafers per unit time, respectively.

Figure 15:
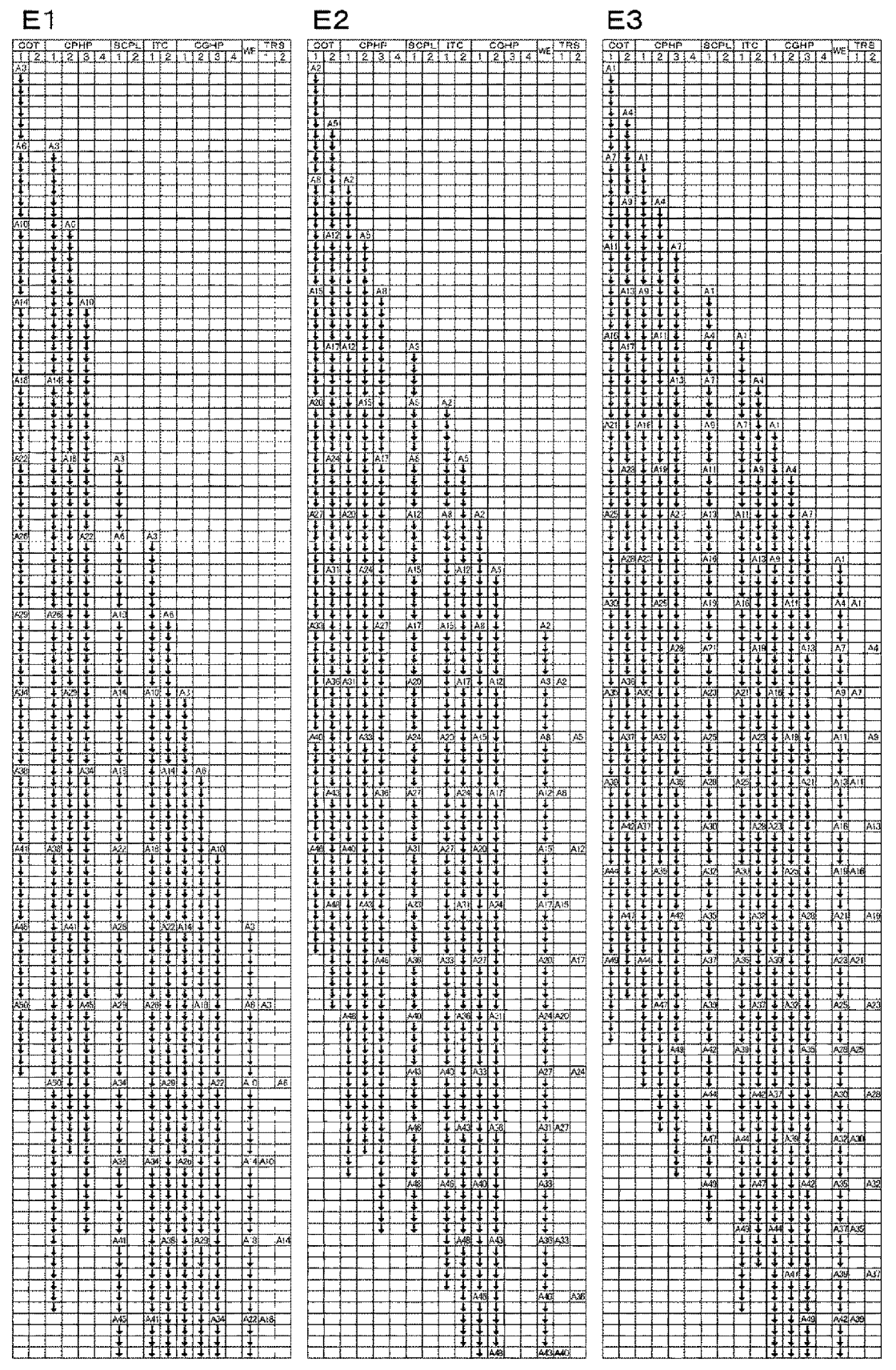
Figure 16:
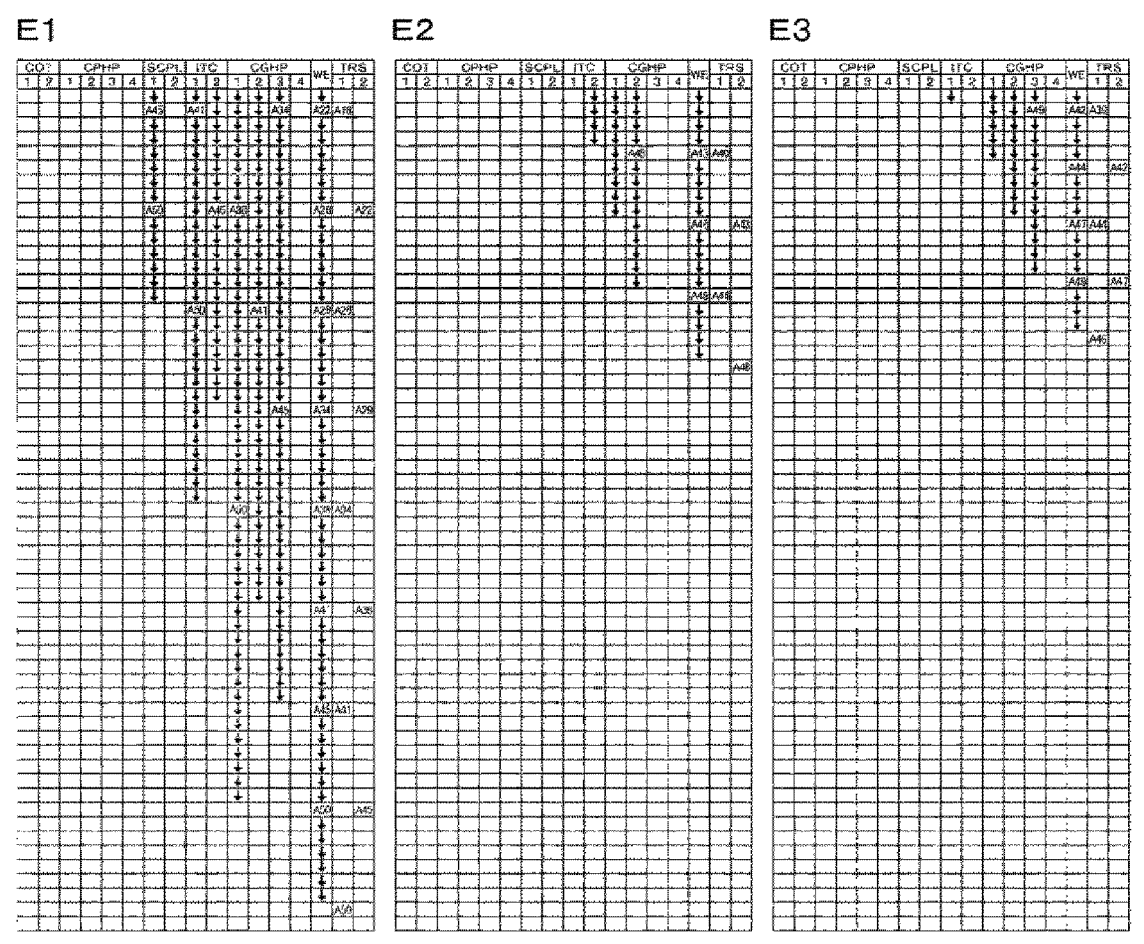

FIGS. 15 and 16 are transfer schedules of the wafers W of PJ-A that corresponds to Tables 6 and 7. That is, the transfer schedules are determined in the manner that after the ratio of the number of wafers W to be carried-in among the unit blocks E1 to E3, the required number of modules of each step, and the number of stay cycles in each step are determined as described above, transfer destinations are allocated as described in Embodiment 4. In addition, for the convenience of illustration, each schedule table is divided into upper and lower portions represented as FIGS. 15 and 16. The lower end portion of the schedule table in FIG. 15 and the upper end portion of the schedule table in FIG. 16 represent the same cycles, and in the schedule table, WES is represented as WE. The wafers W of PJ-A are indicated by the numbers A01 to A50 in an order of being carried into the unit blocks E1 to E3. As represented in the transfer schedules, the exchange transfer is performed in each of COT, CPHP, SCPL', ITC, CGHP, and WES in the unit blocks E1 to E3. In addition, the exchange transfer is performed every time a wafer W is carried-out from each of the modules. Accordingly, the load of the transfer arms F1 to F3 may be suppressed.

Embodiment 6

When the ratio of the number of wafers W to be carried-in is set as described in Embodiment 5, an interval from transfer of a previous wafer W to TRS which is the exit of a unit block until arrival of a next wafer W at the same TRS becomes longer in a unit block having a relatively small ratio of the number of wafers W to be carried-in, than a unit block having a relatively large ratio of the number of wafers W to be carried-in. Further, in the rear stages of the unit blocks E1 to E3, wafers W are carried out from TRS in an order of being carried into the unit blocks E1 to E3, in order to maintain the transferring order of wafers W. That is, wafers W are carried out from TRS in an order of A01, A02, A03 . . . . Accordingly, for the unit block having the relatively small ratio of the number of wafers W to be carried-in (a relatively long carry-in interval), wafers W stay in TRS for a relatively long time. In addition, for the unit block having the relatively long carry-in interval of wafers W, an interval from transfer of a previous wafer W to each module other than TRS which is the exit until transfer of a next wafer W to be exchanged with the previous wafer W is long. Thus, a time required to transfer a wafer W from one step to a next step also becomes long. In Embodiment 6, the number of stay cycles is set to suppress the occurrence of the status described above. Hereinafter, Embodiment 6 will be described, focusing on differences from Embodiment 5.

The outline of Embodiment 6 will be described. For the unit block having the largest ratio of the number of wafers W to be carried-in, the procedures R1 to R4 are performed in the same manner as in Embodiment 5, and the number of stay cycles of a wafer W is calculated such that the exchange transfer is performed in each module. For the other unit blocks, the procedures R1 to R3 are performed, and the procedure R4 is not performed. Instead, the number of stay cycles is calculated using a procedure R5 to be described later, and set such that the exchange transfer is not necessarily performed in each module. The procedure R5 is as follows:

When the required number of modules acquired in the procedure R2=a, the maximum correction value acquired in the procedure R3=b, and the number of stay cycles required for processing as acquired in the procedure R1=c, a calculation of (a−1)×b+1 which is Equation 2 is performed. Then, the calculated value and the value of "c" are compared with each other, and a relatively large value is determined to be the number of stay cycles.

As described above, in Embodiment 6, Equation 1 of the procedure R4 or Equation 2 of the procedure R5 is used depending on the order of the ratio of the number of wafers W to be carried-in. Based on the calculation result, the number of stay cycles is determined for a module of each unit block. Further, as described above, since Equation 2 of the procedure R5 uses the maximum correction value of the procedure R3, Equation 2 of the procedure R5 is applied as a parameter for MUT and CT as well, in addition to the required number of modules, like Equation 1 of the procedure R1.

In order to describe the reason for performing the procedure R5, it is assumed that as a result of calculation, the required number of modules "a"=2 and the maximum correction value "b"=7, for a module of a certain step. That is, it is set that two modules are used such that a wafer W can be carried-in once every 7 cycles. At this time, according to Equation 2, the number of stay cycles is calculated as 8. When the number of stay cycles is 7 which is one cycle smaller than 8, a wafer W may be carried-in once every 7 cycles as described above, and hence, the required number of modules may be 1, rather than 2. That is, Equation 2 calculates the minimum number of stay cycles so as not to change the required number of modules. However, since the number of stay cycles needs to be equal to or larger than "c" for performing a processing, the calculated value according to Equation 2 and "c" are compared with each other as described above, and the number of stay cycles is determined. By determining the number of stay cycles according to the procedure R5 for the unit block of which the ratio of the number of wafers W to be carried-in is not the maximum, the difference of the time after a wafer W is carried into each unit block until the wafer W is transferred to TRS which is the exit is suppressed.

In Embodiment 6, the configuration of the unit blocks E1 to E3, the number of unusable modules, the processing time, and the MUT are the same as those in Embodiment 5. Further, the CT is also 10 seconds which is the same as that in Embodiment 5. Accordingly, the carry-in interval of a wafer W in the unit blocks E1 to E3 is as represented in Table 7 above. In addition, Table 8 below represents parameters calculated in Embodiment 6 as described above. The procedures R1 to R3 are performed for each of the unit blocks E1 to E3. Then, as described in Embodiment 5, in this example, E3 is the unit block having the largest ratio of the number of wafers W to be carried-in (shortest carry-in interval). Hence, the procedure R5 is performed for the unit blocks E1 and E2, and the procedure R4 is performed for the unit block E3, to calculate the number of stay cycles. Accordingly, Table 8 is the same as Table 6, except for the number of stay cycles of the unit blocks E1 and E2.

TABLE 8

| Modules | | SCPL | COT | CPHP | SCPL' | ITC | CGHP | WES | TRS | |
|---|---|---|---|---|---|---|---|---|---|---|
| Number of | E1 | 2 | 1 | 4 | 2 | 2 | 4 | 1 | 2 | |
| Modules | E2 | 2 | 2 | 4 | 2 | 2 | 2 | 1 | 2 | |
| | E3 | 2 | 2 | 4 | 2 | 2 | 4 | 1 | 2 | |
| Processing Time | | 20.0 | 55.0 | 75.0 | 30.0 | 65.0 | 75.0 | 10.0 | — | |
| MUT | | 28.0 | 62.0 | 87.0 | 32.5 | 72.0 | 87.0 | 18.0 | — | |
| MUTCT | | 4.7 | 12.4 | 7.3 | 5.4 | 12.0 | 8.7 | 6.0 | — | |
| Required Number of Stay Cycles | | — | 7 | 9 | 4 | 8 | 9 | 2 | — | |
| Required Number of Modules | All (E1 to E3) | — | 5 | 8 | 3 | 6 | 8 | 2 | — | |
| | E1 | — | 1 | 3 | 1 | 2 | 3 | 1 | — | |
| | E2 | — | 2 | 3 | 1 | 2 | 2 | 1 | — | |
| | E3 | — | 2 | 3 | 1 | 2 | 3 | 1 | — | |
| Correction Value | E1 | — | 7 | 3 | 4 | 4 | 3 | 2 | Correction Value (Maximum Value) | 7 |
| | E2 | — | 4 | 3 | 4 | 4 | 5 | 2 | | 5 |
| | E3 | — | 4 | 3 | 4 | 4 | 3 | 2 | | 4 |
| Number of Stay Cycles | E1 | — | 7 | 15 | 4 | 8 | 15 | 2 | 1 | |
| | E2 | — | 7 | 11 | 4 | 8 | 10 | 2 | 1 | |
| | E3 | — | 8 | 12 | 4 | 8 | 12 | 4 | 1 | |

Specifically, as for a procedure of calculating the number of stay cycles in COT of the unit block E1, the required number of modules=1, the maximum correction value=7, the number of stay cycles required for processing=7, and according to Equation 2 of the procedure R5, (1−1)×7+1=1. Since 7 which is the number of stay cycles required for processing is larger than 1 which is the calculation result of the equation above, 7 is determined to be the number of stay cycles. Similarly, as for a procedure of calculating the number of stay cycles in COT of the unit block E2, the required number of modules=2, the maximum correction value=5, the number of stay cycles required for a processing=7, and according to Equation 2 of the procedure R5, (2−1)×5+1=6. Since 7 which is the number of stay cycles required for processing is larger than 6 which is the calculation result of the equation above, 7 is determined to be the number of stay cycles. As for a procedure of calculating the number of stay cycles in CPHP of the unit block E1, the required number of modules=3, the maximum correction value=7, the number of stay cycles required for processing=9, and according to Equation 2 of the procedure R5, (3−1)×7+1=15. Since 15 which is the calculation result of the equation above is larger than 9 which is the number of stay cycles required for processing, 15 is determined to be the number of stay cycles. Similarly, as for a procedure of calculating the number of stay cycles in CPHP of the unit block E2, the required number of modules=3, the maximum correction value=5, the number of stay cycles required for processing=7, and according to Equation 2 of the procedure R5, (3−1)×5+1=11. Since 11 which is the calculation result of the equation above is larger than 7 which is the number of stay cycles required for processing, 11 is determined to be the number of stay cycles.

Figure 17:
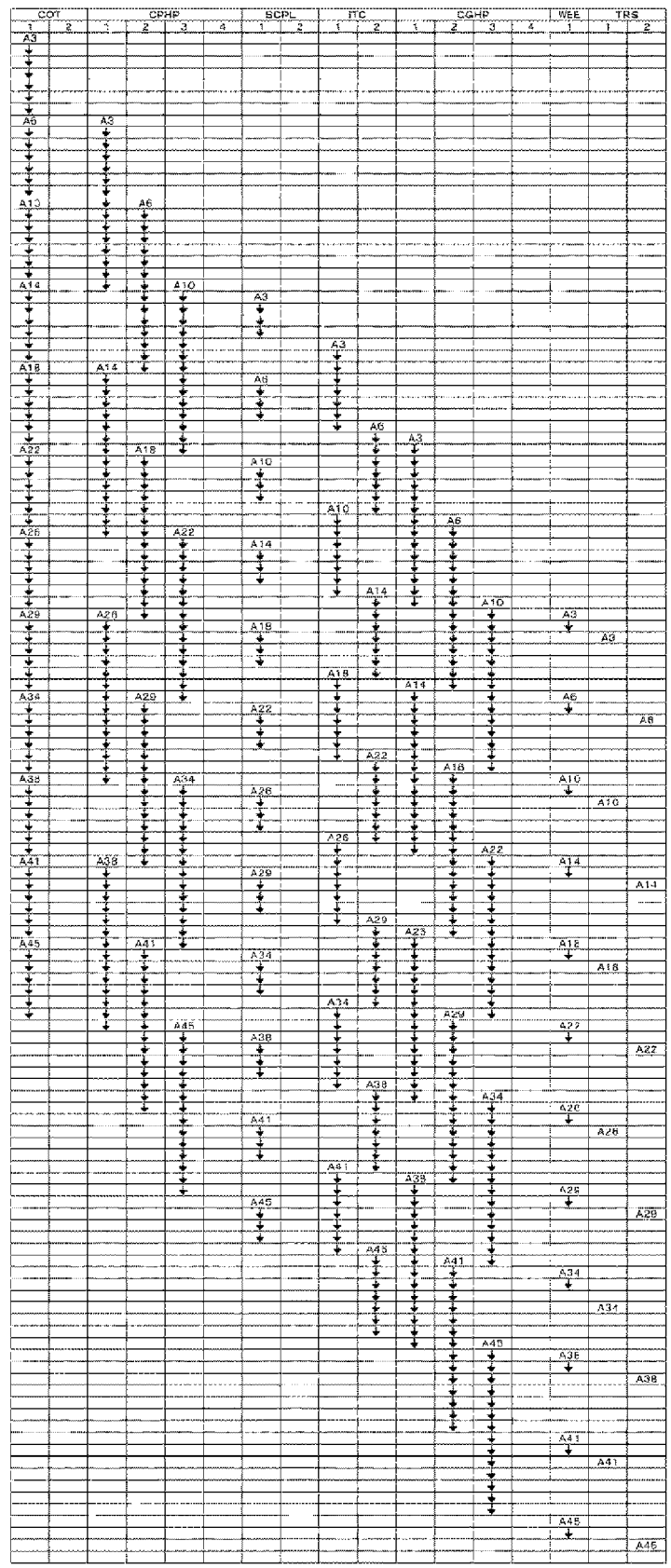
FIG. 17 is a table view illustrating a transfer schedule of an embodiment.
Figure 18:
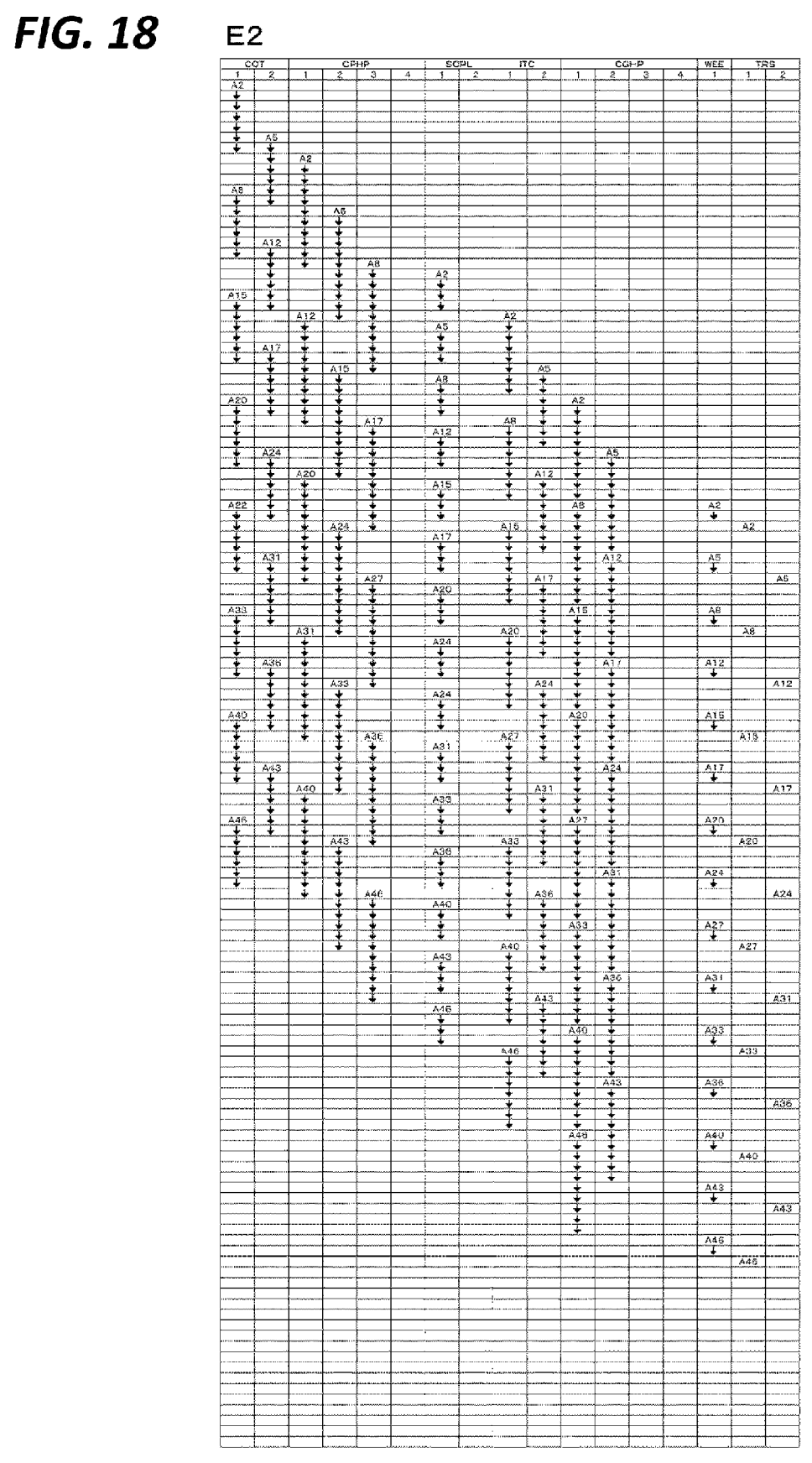

FIGS. 17, 18, and 19 illustrate the transfer schedules of the wafers W of PJ-A that correspond to Table 8, in the unit blocks E1, E2, and E3, respectively. In addition, while FIG. 16 represents the tables of the transfer schedules of the unit blocks E1 to E3 in one page, each of FIGS. 17 to 19 represents the transfer schedule of one unit block E in one page to facilitate the viewing. That is, in the tables of FIGS. 17 to 19, the cells having the same height represent the same cycles, as in FIG. 16. In the unit block E3, the exchange transfer is performed for COT, CPHP, SCPL', ITC, CGHP, and WES, as in Embodiment 5. That is, a wafer W is carried into a module to which the wafer W is determined to be transferred, in a cycle where a previously carried-in wafer W is carried out from the module. The exchange transfer is not performed for COT, CPHP, SCPL', ITC, CGHP, and WES in the unit blocks E1 and E2. That is, a wafer W is carried into a module to which the wafer W is determined to be transferred, in a cycle after a cycle where a previously carried-in wafer W is carried out from the module. In the unit blocks E1 and E2 in which the exchange transfer is not performed, the number of cycles after a wafer W is carried into a unit block until the wafer W is transferred to TRS which is the exit is suppressed. As a result, the number of cycles after a first wafer W of PJ-A is carried into the unit blocks E1 to E3 until the last wafer W of PJ-A is transferred to TRS is shorter than that in Embodiment 5. Thus, according Embodiment 6, the throughput in the unit blocks E1 to E3 may be further improved.

In addition, the controller 10 performs the various calculations of the above-described procedures R1 to R5 and the setting of transfer schedules using the calculated required number of modules and the calculated number of stay cycles. That is, the program of the controller 10 is configured to be able to set transfer schedules. In the above-described example, the maximum value of the MUTCTs and the ACT are compared with each other to determine the block CT as described above. However, when a unit block is configured to include a very small number of steps, and the maximum value of the MUTCTs is reliably larger than the ACT, the controller 10 may determine the block CT only based on the MUTCT, without performing the comparison. Meanwhile, when a unit block is configured to include a very large number of steps, the controller 10 may determine the ACT to be the block CT without performing the comparison. In this way, the controller 10 may not compare the maximum value of the MUTCTs and the ACT with each other.

In addition, in Embodiment 6, the procedure R4 for implementing the performance of the exchange transfer is performed only for the unit block having the largest ratio of the number of wafers W to be carried-in. However, the present disclosure is not limited thereto. When there are three or more unit blocks having the same configuration, for example, the procedure R4 may be performed for a unit block having the largest ratio of the number of wafers W to be carried-in and a unit block having the second largest ratio of the number of wafers W to be carried-in, to determine the number of stay cycles. However, the throughput may be effectively improved when the procedure R4 is performed only for the unit block having the largest ratio of the number of wafers W to be carried-in as in Embodiment 6. Further, as described above, the substrate processing apparatus may be configured such that the processing block is not divided into the plurality of unit blocks (layers), that is, the processing block is provided with only one unit block. In that case, a transfer schedule of the unit block may be set by performing the above-described procedures R1 to R4. In addition, in Embodiments 1 to 3, a transfer schedule of wafers W is set without performing the procedures R1 to R5. However, when Embodiments 1 to 3 are executed as well, the ratio of the number of wafers W to be carried-in may be set among the unit blocks E as described in Embodiment 5.

In addition, the embodiments described herein are merely examples in all aspects, and should not be construed as limiting the present disclosure. The foregoing embodiments may be omitted, substituted, or modified in various forms, or combined with each other without departing from the scope and the gist of the claims attached herein.

Evaluation Test 1

Evaluation Test 1 conducted by simulation will be described. In Evaluation Test 1, a test apparatus provided with the unit block E6 as in the applying and developing apparatus 1 was used, and a wafer W group of PJ-A, a wafer W group of PJ-B, a wafer W group of PJ-C, and a wafer W group of PJ-D were transferred from the carriers 10, processed, and caused to be returned to the carriers 10. When the wafers W of the four PJs were transferred, an arrival time of each PJ at the unit block, a processing time in the unit block, and a processing time of PJ were measured in a case where a transfer schedule was set using the method of Comparative Example 1 and in a case where a transfer schedule was set using the method of Embodiment 2. The arrival time at the unit block refers to a time from a time point when a first wafer W of a PJ is carried out from a carrier 10 to a time point when the first wafer W is carried into the entrance (delivery module TRS6) of the unit block E6. The processing time in the unit block refers to a time from the time point when the first wafer W of the PJ is carried into the entrance of the unit block E6 to a time point when the first wafer W is carried into the exit (temperature adjustment module SCPL') of the unit block. The processing time of PJ refers to a time from the time point when the first wafer W of the PJ is carried out from the carrier 10 to a time point when the last wafer of the PJ is carried into the carrier 10. Then, difference values in arrival time at the unit block, processing time in the unit block, and processing time of PJ were acquired by subtracting the results obtained in the case where a transfer schedule was set using the method of Comparative Example 1 and the results obtained in the case where a transfer schedule was set using the method of Embodiment 2, from each other.

Table 9 below summarizes the difference values. Further, in the case where a transfer schedule was set using the method of Comparative Example 1, the processing time in the unit block was PJ-C>PJ-A>PJ-D>PJ-B, and in the case where a transfer schedule was set using the method of Embodiment 2, the processing time in the unit block was PJ-B>PJ-D>PJ-C>PJ-A.

TABLE 9

|  | Difference in arrival time at unit block | Difference in processing time in unit block | Difference in processing time of PJ |
| --- | --- | --- | --- |
| PJ-A | 12.28048992 sec | 78.9344902 sec | 83.22116995 sec |
| PJ-B | 12.23428011 sec | 0.360920191 sec | 12.61249018 sec |

TABLE 9-continued

|  | Difference in arrival time at unit block | Difference in processing time in unit block | Difference in processing time of PJ |
|---|---|---|---|
| PJ-C | 88.3169601 sec | 116.69207 sec | 205.57634 sec |
| PJ-D | 88.32300019 sec | 35.85062981 sec | 138.3481102 sec |

As represented in Table 9, the processing time of PJ-A and PJ-C in the unit block was largely reduced by setting a transfer schedule using the method of Embodiment 2. This is because PJ-A and PJ-C of which throughput was originally high were not affected by PJ-B and PJ-D of which throughput was relatively low, when a transfer schedule was set using the method of Embodiment 2. As the processing time in the unit block was reduced, the processing time of PJ was also largely reduced for PJ-A and PJ-C. Further, as represented in Table 9, the processing time in the unit block and the processing time of PJ were also reduced for PJ-B and PJ-D, by setting a transfer schedule using the method of Embodiment 2. Accordingly, the evaluation test confirms the effect of the applying and developing apparatus 1 in obtaining the high throughput.

Evaluation Test 2

As an evaluation test 2, in an applying and developing apparatus having substantially the same configuration as that of the applying and developing apparatus 1, a transfer schedule is set using the method of the embodiment or the method of the comparative example, and a required transfer time of one PJ was measured by simulation. The required transfer time refers to a time required after a first wafer W of a PJ is carried out from a carrier C until the last wafer W of the PJ is returned to the carrier C. In addition, the method of the embodiment is a method of determining the number of stay cycles and the carry-in ratio of each unit block using the procedures R1 to R5 described in Embodiment 6. The method of the comparative example is a method of determining the carry-in ratio of each unit block according to the number of usable modules throughout the unit blocks without using the procedures R1 to R5.

In the applying and developing apparatus used in Evaluation Test 2, an unexposed wafer W is transferred in an order of carrier C→TRS→ADH→SCPL→block CT→CPHP→SCPL→CPT→CGCH→WES→TRS→BST→ICPL→TRS. An exposed wafer W is transferred in an order of TRS→CPHP→SCPL→DEV→CLHA→SCPL→TRS, and returned to the carrier C. ADH is a hydrophobic processing module, BCT is an antireflection film formation module, BST is a back surface cleaning module, ICPL is a temperature adjustment module, and CLHA is a heating module. In addition, the PJ described above is a PJ that transfers 25 wafers W. Table 10 below represents the number of usable modules and the processing time for each module. In addition, the simulation was performed for each of a case where blocking is performed for a portion of the usable modules (setting carry-in prohibited modules), and a case where the blocking is not performed. The blocking was performed for one block CT of the unit block E1 and two PABs of the unit block E2. That is, a blocked module becomes the same state as that of an unusable module.

TABLE 10

| Modules | Carrier | TRS | ADH | SCPL | BCT | CPHP | SCPL | COT | CGCH | WES | TRS |
|---|---|---|---|---|---|---|---|---|---|---|---|
| Number of Modules | — | 8 | 6 | 6 | 6 | 12 | 6 | 6 | 12 | 3 | 6 |
| Processing Time (sec) | — | — | 50 | 20 | 55 | 75 | 30 | 65 | 75 | 10 | — |

| Modules | BST | ICPL | TRS | TRS | CPHP | SCPL | DEV | CLHA | SCPL | TRS | Carrier |
|---|---|---|---|---|---|---|---|---|---|---|---|
| Number of Modules | 6 | 2 | 2 | 12 | 12 | 6 | 12 | 12 | 6 | 2 | — |
| Processing Time (sec) | 10 | 5 | — | — | 75 | 30 | 102.2 | 75 | 20 | — | — |

As a result of Evaluation Test 2, in both the case where blocking was performed and the case where blocking was not performed, the required transfer time for the case where the method of the embodiment was used was shorter than that for the case where the method of the comparative example was used. The difference in required transfer time between the case where the method of the embodiment was used and the case where the method of the comparative example was used was 57.12 seconds when blocking was performed and 235.13 seconds when blocking was not performed. Thus, when blocking was performed, especially, the required transfer time could be reduced. Accordingly, from Evaluation Test 2, the effect of Example 6 in improving the throughput of the apparatus was obtained.

According to the present disclosure, when substrates of a plurality of lots which are different from each other in required time of stay in a module are sequentially transferred and processed, the load of a substrate transfer mechanism may be suppressed so that the throughput of the apparatus may be approved.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising;
a processing block in which a substrate is sequentially transferred from an upstream-side module to a downstream-side module and processed;

a carry-in/out transfer mechanism including a transfer arm configured to deliver the substrate between a carrier in which the substrate is stored and the processing block, thereby carrying-in/out the substrate with respect to modules of the processing block;

a carry-out module configured to place the substrate therein after the substrate is processed such that the substrate is carried out from the processing block by the carry-in/out transfer mechanism;

a multi-module configured by a plurality of modules provided on an upstream side of the carry-out module and having a same order in which the substrate is transferred in the processing block;

a main transfer mechanism including a plurality of substrate holders that independently move forward/backward with respect to each module, and configured to move around in a transfer path provided in the processing block to deliver the substrate among the modules; and a controller configured to set a first transfer schedule including a determination of a number of modules to become transfer destinations of the substrate in the multi-module, and a determination of a number of stay cycles which is a number of times that the main transfer mechanism moves around after the substrate is carried into the multi-module until the substrate is carried out, based on:

a time parameter which is a substrate transfer time that corresponds to a number of transfer processes of the main transfer mechanism which is required to transfer the substrate carried into the processing block to the carry-out module, or a maximum time of times obtained for a plurality of steps included in a processing in a manner that among a module group including the multi-module and provided in the processing block to perform the processing on the substrate, a required stay time of the substrate in a module of a same step is divided by a number of usable modules in the step, the required stay time of the substrate in a module constituting the multi-module, and a cycle time which is a time when the main transfer mechanism moves around once in the transfer path.

2. The substrate processing apparatus according to claim 1, wherein the number of modules to become transfer destinations of the substrate in the multi-module is determined by a value obtained by dividing the required stay time of the substrate in the module by the time parameter, and the number of stay cycles is determined based on the number of modules.

3. The substrate processing apparatus according to claim 1, wherein the time parameter is a relatively longer time of the substrate transfer time and the maximum time of the times obtained for the plurality of steps.

4. The substrate processing apparatus according to claim 1, wherein the processing block is provided with N unit blocks (N is an integer) each of which includes the carry-out module, the module group, and the main transfer mechanism, and each perform a same processing on the substrate, the substrate transfer time corresponds to the number of transfer processes and the N, the number of usable modules in the same step is a total number of usable modules in the same step throughout the unit blocks, and the number of modules to become transfer destinations of the substrate and the number of stay cycles are determined for each unit block.

5. The substrate processing apparatus according to claim 4, wherein the controller determines a ratio of a number of substrates to be carried-in among the unit blocks, based on a maximum value for each unit block obtained by dividing the required stay time of the substrate in the module of each step by the number of usable modules, and the time parameter.

6. The substrate processing apparatus according to claim 5, wherein the number of modules to become transfer destinations of the substrate in the multi-module provided in each unit block is determined by a value obtained by dividing the required stay time of the substrate in the module by the time parameter, and the controller determines the number of stay cycles of the substrate in the multi-module of each unit block, based on an equation that uses the number of modules to become transfer destinations of the substrate, the required stay time of the substrate in the module, and the cycle time, and corresponds to an order of the ratio of the number of substrates to be carried-in.

7. The substrate processing apparatus according to claim 6, wherein the N unit blocks include a first unit block and a second unit block, when the first unit block has a larger ratio of the number of substrates to be carried-in than that of the second unit block, substrates of a same lot are transferred to a module to which the substrates are determined to be transferred in the multi-module in a manner that a substrate is carried into the module in a cycle in which a substrate previously carried into the module is carried out from the module, for the first unit block, and a substrate is carried into the module in a cycle after a cycle in which a substrate previously carried into the module is carried out from the module, for the second unit block.

8. The substrate processing apparatus according to claim 1, wherein the controller performs calculating the number of stay cycles based on the cycle time and the required stay time of the substrate in a module constituting the multi-module, and allocating a transfer destination of each substrate to each module constituting the multi-module based on the number of stay cycles in an order in which the substrate is carried into the processing block, by setting a second transfer schedule, instead of setting the first transfer schedule, for determining a transfer destination of each substrate in a manner that among a plurality of modules to which the substrate is able to be transferred, a module is a transfer destination, from which a substrate transferred to the multi-module earlier than the substrate of which transfer destination is to be determined is carried out in a cycle closest to a reference cycle in which the substrate of which transfer destination is to be determined is transferred to the multi-module.

9. The substrate processing apparatus according to claim 8, wherein the cycle closest to the reference cycle includes a same cycle as the reference cycle, and in the same cycle, carry-out of a substrate by one of the substrate holders and carry-in of a substrate by the other of the substrate holders are performed with respect to one module included in the multi-module.

10. The substrate processing apparatus according to claim 8, wherein when the lots of the substrates to be sequentially transferred to the processing block are a first lot and a second lot, the number of stay cycles for the substrates of the first lot and the substrates of the second lot is calculated based on the cycle time commonly set for the first lot and the second lot.

11. The substrate processing apparatus according to claim 8, wherein when the lots of the substrates to be sequentially transferred to the processing block are a first lot and a second lot,
the carry-in/out transfer mechanism transfers a substrate to the processing block every N cycles (N is an integer), and
the number of stay cycles is a value obtained by correcting a division value obtained from dividing the stay time by a cycle time when the first lot and the second lot are transferred, to a value that is equal to or larger than the division value and an integral multiple of the N.

12. The substrate processing apparatus according to claim 11, wherein the processing block is provided with N unit blocks that each include the carry-out module, the multi-module, and the main transfer mechanism, and each perform a same processing on the substrate, and
the carry-in/out transfer mechanism transfers the substrate to each of the N unit blocks every N cycles.

13. The substrate processing apparatus according to claim 8, wherein when the lots of the substrates to be sequentially transferred to the processing block are a first lot and a second lot,
the cycle time corresponding to the first lot and the cycle time corresponding to the second lot are parameters determined based on the stay time and the number of modules constituting the multi-module.

14. The substrate processing apparatus according to claim 8, wherein the multi-module includes an upstream-side multi-module and a downstream-side multi-module in a transfer flow of the substrate, and
a transfer destination of the substrate is determined for each of the upstream-side multi-module and the downstream-side multi-module, according to the second transfer schedule.

15. The substrate processing apparatus according to claim 8, wherein when the lots of the substrates to be sequentially transferred to the processing block are a first lot and a second lot, and when each of the first lot and the second lot is processed in the multi-module such that predetermined processing parameters for the first lot and the second lot are different from each other,
instead of performing the second transfer schedule, transfer destinations of the substrates of the second lot that are counted from the first one to amount to the number of modules of the multi-module are determined in a manner that among a plurality of modules to which the substrates are able to be transferred, a module is a transfer destination, from which a substrate transferred to the multi-module earlier than the substrate of which transfer destination is to be determined is carried out in a cycle farthest from a reference cycle in which the substrate of which transfer destination is to be determined is transferred.

16. The substrate processing apparatus according to claim 15, wherein the multi-module is a heating module including a hot plate for heating the substrate placed on the hot plate, or an exposure module that irradiates the substrate with light from a light irradiator to expose the substrate, and
the predetermined processing parameters are a temperature of the hot plate, and an intensity of light irradiation by the light irradiator.

17. A substrate processing method using a substrate processing apparatus, the substrate processing apparatus including:
a processing block in which a substrate is sequentially transferred from an upstream-side module to a downstream-side module and processed;
a carry-in/out transfer mechanism including a transfer arm configured to deliver the substrate between a carrier in which the substrate is stored and the processing block, thereby performing carry-in/out of the substrate with respect to the processing block;
a carry-out module configured to place the substrate therein after the substrate is processed such that the substrate is carried out from the processing block by the carry-in/out transfer mechanism;
a multi-module configured by a plurality of modules provided on an upstream side of the carry-out module and having a same order in which the substrate is transferred in the processing block; and
a main transfer mechanism including a plurality of substrate holders that independently move forward/backward with respect to each module, and configured to move around in a transfer path provided in the processing block to deliver the substrate among the modules;
the substrate processing method comprising:
setting a first transfer schedule including a determination of a number of modules to become transfer destinations of the substrate in the multi-module, and a determination of a number of stay cycles which is a number of times that the main transfer mechanism moves around after the substrate is carried into the multi-module until the substrate is carried out, based on:
a time parameter which is a substrate transfer time that corresponds to a number of transfer processes of the main transfer mechanism which is required to transfer the substrate carried into the processing block to the carry-out module, or a maximum time of times obtained for a plurality of steps included in a processing in a manner that among a module group including the multi-module and provided in the processing block to perform the processing on the substrate, a required stay time of the substrate in a module of a same step is divided by a number of usable modules in the step,
the required stay time of the substrate in a module constituting the multi-module, and
a cycle time which is a time when the main transfer mechanism moves around once in the transfer path.

* * * * *